US012575276B2

(12) United States Patent
Chen et al.

(10) Patent No.: US 12,575,276 B2
(45) Date of Patent: Mar. 10, 2026

(54) DISPLAY SUBSTRATE AND DISPLAY APPARATUS

(71) Applicants:Chengdu BOE Optoelectronics Technology Co., Ltd., Sichuan (CN); BOE Technology Group Co., Ltd., Beijing (CN)

(72) Inventors: Jiaxing Chen, Beijing (CN); Yue Long, Beijing (CN); Lili Du, Beijing (CN); Jie Li, Beijing (CN); Yi Zhang, Beijing (CN); Tinghua Shang, Beijing (CN); De Li, Beijing (CN); Biao Liu, Beijing (CN); Yixuan Long, Beijing (CN); Zuoji Niu, Beijing (CN); Jiangtao Deng, Beijing (CN); Xiaoyan Yang, Beijing (CN); Xiping Li, Beijing (CN); Meng Li, Beijing (CN); Du Chen, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 398 days.

(21) Appl. No.: 18/032,810

(22) PCT Filed: May 12, 2022

(86) PCT No.: PCT/CN2022/092554
§ 371 (c)(1),
(2) Date: Apr. 20, 2023

(87) PCT Pub. No.: WO2023/216200
PCT Pub. Date: Nov. 16, 2023

(65) Prior Publication Data
US 2024/0381708 A1 Nov. 14, 2024

(51) Int. Cl.
*H10K 59/131* (2023.01)
*H10K 59/12* (2023.01)
(Continued)

(52) U.S. Cl.
CPC ....... *H10K 59/131* (2023.02); *H10K 59/1213* (2023.02); *H10K 59/1216* (2023.02);
(Continued)

(58) Field of Classification Search
CPC ............. H10K 59/131; H10K 59/1213; H10K 59/1216; H10K 59/88; H10K 59/12;
(Continued)

(56) References Cited

U.S. PATENT DOCUMENTS

2013/0285996 A1 10/2013 Lee et al.
2022/0069047 A1 3/2022 Yang et al.
(Continued)

FOREIGN PATENT DOCUMENTS

CN 103377593 A 10/2013
CN 111916486 A 11/2020
(Continued)

*Primary Examiner* — Douglas Wilson
(74) *Attorney, Agent, or Firm* — Ling Wu; Stephen Yang; Ling and Yang Intellectual Property

(57) ABSTRACT

Disclosed is a display substrate, including a base substrate (100), a circuit structure layer disposed on the base substrate (100), and a light emitting structure layer. The circuit structure layer includes a plurality of pixel circuits located in a first display region (A1), at least one first trace 231 extending along a first direction (D1), at least one second trace 232 extending along a second direction (D2), and at least one third trace located in a peripheral region (BB). The at least one first trace (231) is electrically connected with the at least one second trace (232) and the at least one third trace
(Continued)

is electrically connected with at least one of following; the at least one first trace (231) and the at least one second trace (232).

18 Claims, 18 Drawing Sheets

(51) Int. Cl.

| | |
|---|---|
| *H10K 59/121* | (2023.01) |
| *G02B 6/42* | (2006.01) |
| *H05K 1/02* | (2006.01) |
| *H10K 59/65* | (2023.01) |

(52) U.S. Cl.
CPC ... *G02B 6/4275* (2013.01); *G09G 2300/0413* (2013.01); *G09G 2300/0426* (2013.01); *H05K 1/0259* (2013.01); *H10K 59/12* (2023.02); *H10K 59/65* (2023.02)

(58) Field of Classification Search
CPC .... H10K 59/65; G02B 6/4275; H05K 1/0259; G09G 2300/0413; G09G 2300/0426
See application file for complete search history.

(56) References Cited

U.S. PATENT DOCUMENTS

| | | | |
|---|---|---|---|
| 2022/0415996 A1* | 12/2022 | Jeong | ................... H10K 59/131 |
| 2023/0091142 A1 | 3/2023 | Huang et al. | |

FOREIGN PATENT DOCUMENTS

| | | |
|---|---|---|
| CN | 113571566 A | 10/2021 |
| CN | 113764461 A | 12/2021 |
| CN | 114373774 A | 4/2022 |

* cited by examiner

DISPLAY SUBSTRATE AND DISPLAY APPARATUS

CROSS-REFERENCE TO RELATED APPLICATION

The present application is a U.S. National Phase Entry of International Application No. PCT/CN2022/092554 having an international filing date of May 12, 2022. The entire contents of the above-identified application are hereby incorporated by reference.

TECHNICAL FIELD

The present disclosure relates to, but is not limited to, the field of display technologies, in particular to a display substrate and a display apparatus.

BACKGROUND

An Organic Light Emitting Diode (OLED) and a Quantum dot Light Emitting Diode (QLED) are active light emitting display devices and have advantages of self-illumination, a wide viewing angle, a high contrast ratio, low power consumption, an extremely high reaction speed, lightness and thinness, bendability, and a low cost, etc. A Full Display with Camera technology is a brand-new technology proposed to increase a screen-to-body ratio of a display apparatus.

SUMMARY

The following is a summary of subject matters described herein in detail. The summary is not intended to limit the protection scope of claims.

Embodiments of the present disclosure provide a display substrate and a display apparatus.

In one aspect, an embodiment provides a display substrate, including a base substrate, a circuit structure layer disposed on the base substrate, and a light emitting structure layer located on a side of the circuit structure layer away from the base substrate. The base substrate includes a display region and a peripheral region located at a periphery of the display region. The display region includes a first display region and a second display region. The first display region at least partially surrounds the second display region. The circuit structure layer includes a plurality of pixel circuits located in the first display region, at least one first trace extending along a first direction, at least one second trace extending along a second direction, and at least one third trace located in the peripheral region. The light emitting structure layer includes a plurality of first light emitting elements located in the first display region and a plurality of second light emitting elements located in the second display region. The plurality of pixel circuits include a plurality of first pixel circuits and a plurality of second pixel circuits. At least one first pixel circuit in the plurality of first pixel circuits is electrically connected with at least one first light emitting element in the plurality of first light emitting elements of the first display region, at least one second pixel circuit in the plurality of second pixel circuits is electrically connected with at least one second light emitting element in the plurality of second light emitting elements of the second display region. At least one first trace and at least one second trace of the first display region are electrically connected. At least one third trace is electrically connected with at least one of following: at least one first trace and at least one second trace. Herein, the first direction intersects the second direction.

In some exemplary implementation modes, the at least one first trace and the at least one second trace are of an integral structure.

In some exemplary implementation modes, the plurality of pixel circuits further include: a plurality of invalid pixel circuits, an orthographic projection of the at least one second trace on the base substrate is overlapped with an orthographic projection of at least one invalid pixel circuit on the base substrate.

In some exemplary implementation modes, an orthographic projection of the at least one first trace on the base substrate is located between two adjacent rows of pixel circuits.

In some exemplary implementation modes, the peripheral region includes: a first bezel region and a second bezel region located on opposite sides of the display region along the second direction; the at least one third trace includes: a first power supply line located in the first bezel region and a first power connection line located in the second bezel region; the at least one second trace is electrically connected with at least one of the first power connection line and the first power supply line.

In some exemplary implementation modes, the first power supply line includes a first sub-power supply line and a second sub-power supply line stacked and electrically connected with each other; the at least one second trace, the first power connection line, and the first sub-power supply line are of an integral structure.

In some exemplary implementation modes, in a direction perpendicular to the display substrate, the circuit structure layer of the first display region includes: a semiconductor layer, a first conductive layer, a second conductive layer, and a third conductive layer disposed on the base substrate. The semiconductor layer at least includes: an active layer of a transistor of at least one pixel circuit. The first conductive layer at least includes: a gate of the transistor of the at least one pixel circuit and a first capacitor plate of a storage capacitor. The second conductive layer at least includes: a second capacitor plate of the storage capacitor of the at least one pixel circuit. The third conductive layer at least includes the first trace and the second trace.

In some exemplary implementation modes, the circuit structure layer of the first display region further includes: a fourth conductive layer located on a side of the third conductive layer away from the base substrate. The fourth conductive layer at least includes a data line, a dummy data line, and a first power supply transmission line. The data line is electrically connected with the plurality of first pixel circuits or the plurality of second pixel circuits, the first power supply transmission line is electrically connected with the plurality of pixel circuits, and the dummy data line is electrically connected with the second trace. The dummy data line and the first power supply transmission line are both electrically connected with the third trace.

In some exemplary implementation modes, the second conductive layer further includes: a first initial signal line and a second initial signal line; the first initial signal line and the second initial signal line both extend along the first direction. The peripheral region further includes: a first initial peripheral trace and a second initial peripheral trace; the first initial peripheral trace and the second initial peripheral trace extend along the second direction. The first initial signal line is electrically connected with the first initial peripheral trace through a first initial transfer line; the second initial signal line is electrically connected with the second initial peripheral trace through a second initial transfer line; the first initial transfer line and the second initial transfer line are located in the third conductive layer.

In some exemplary implementation modes, the first conductive layer further includes: a scan line and a light emitting control line extending along the first direction. The peripheral region further includes a scan output line and a light emitting control output line. The scan line is electrically connected with the scan output line through a scan transfer line; the light emitting control line is electrically connected with the light emitting control output line through a light emitting control transfer line. The scan transfer line and the light emitting control transfer line are located in the third conductive layer, and the scan output line and the light emitting control output line are located in the second conductive layer or the first conductive layer.

In some exemplary implementation modes, the pixel circuit at least includes: a drive transistor and a first light emitting control transistor, the first light emitting control transistor has a gate electrically connected with a light emitting control line, a first electrode electrically connected with a first power supply line, and a second electrode connected with a first electrode of the drive transistor; the third conductive layer further includes: a first shielding electrode; an orthographic projection of the first shielding electrode on the base substrate at least partially covers an orthographic projection of a channel region of an active layer of the first light emitting control transistor on the base substrate.

In some exemplary implementation modes, the pixel circuit further includes: a first reset transistor, the first reset transistor has a gate electrically connected with a first reset control line, a first electrode electrically connected with a first initial signal line, and a second electrode electrically connected with a gate of the drive transistor. The third conductive layer further includes: a second shielding electrode; an orthographic projection of the second shielding electrode on the base substrate at least partially covers an orthographic projection of a channel region of an active layer of the first reset transistor on the base substrate.

In some exemplary implementation modes, a third insulation layer is disposed between the second conductive layer and the third conductive layer, and the third insulation layer of the first display region is provided with a plurality of vias; a distance between an orthographic projection of at least one via on the base substrate and an orthographic projection of at least one trace of the first conductive layer or the second conductive layer on the base substrate in the second direction is greater than or equal to 2 microns.

In another aspect, an embodiment provides a display apparatus, which includes the aforementioned display substrate.

In some exemplary implementation modes, the display apparatus further includes a sensor located on a side of a non-display surface of the display substrate, an orthographic projection of the sensor on the display substrate is overlapped with a second display region of the display substrate.

Other aspects may be understood upon reading and understanding drawings and detailed description.

BRIEF DESCRIPTION OF DRAWINGS

Accompanying drawings are used for providing further understanding of technical solutions of the present disclosure, constitute a part of the specification, and together with the embodiments of the present disclosure, are used for explaining the technical solutions of the present disclosure, but do not constitute limitations on the technical solutions of the present disclosure. Shapes and sizes of one or more components in the drawings do not reflect true scales, and are only intended to schematically describe contents of the present disclosure.

5

Figure 8:
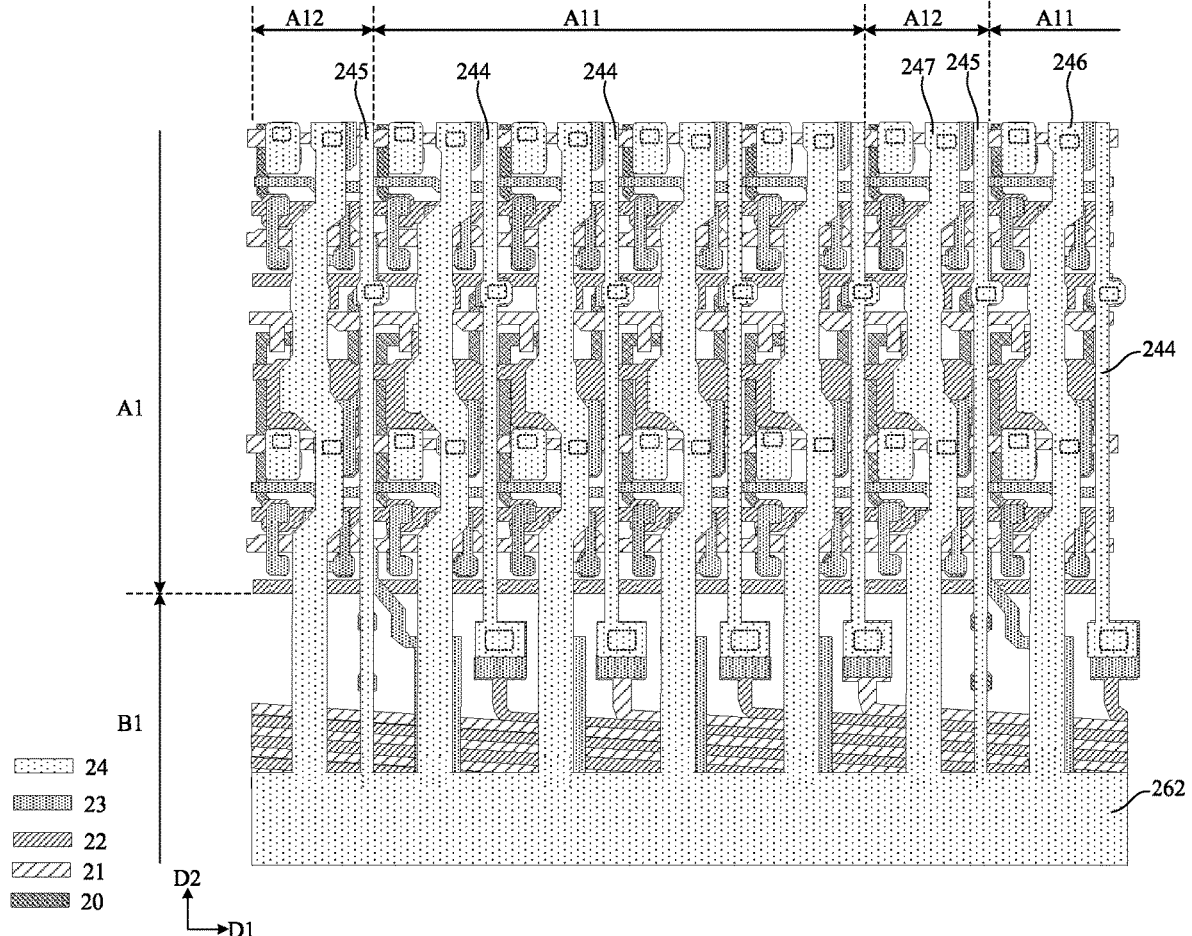
FIG. 8 is a partial enlarged schematic diagram of a circuit structure layer of a region S3 in FIG. 4.
Figures 15A, 15B:
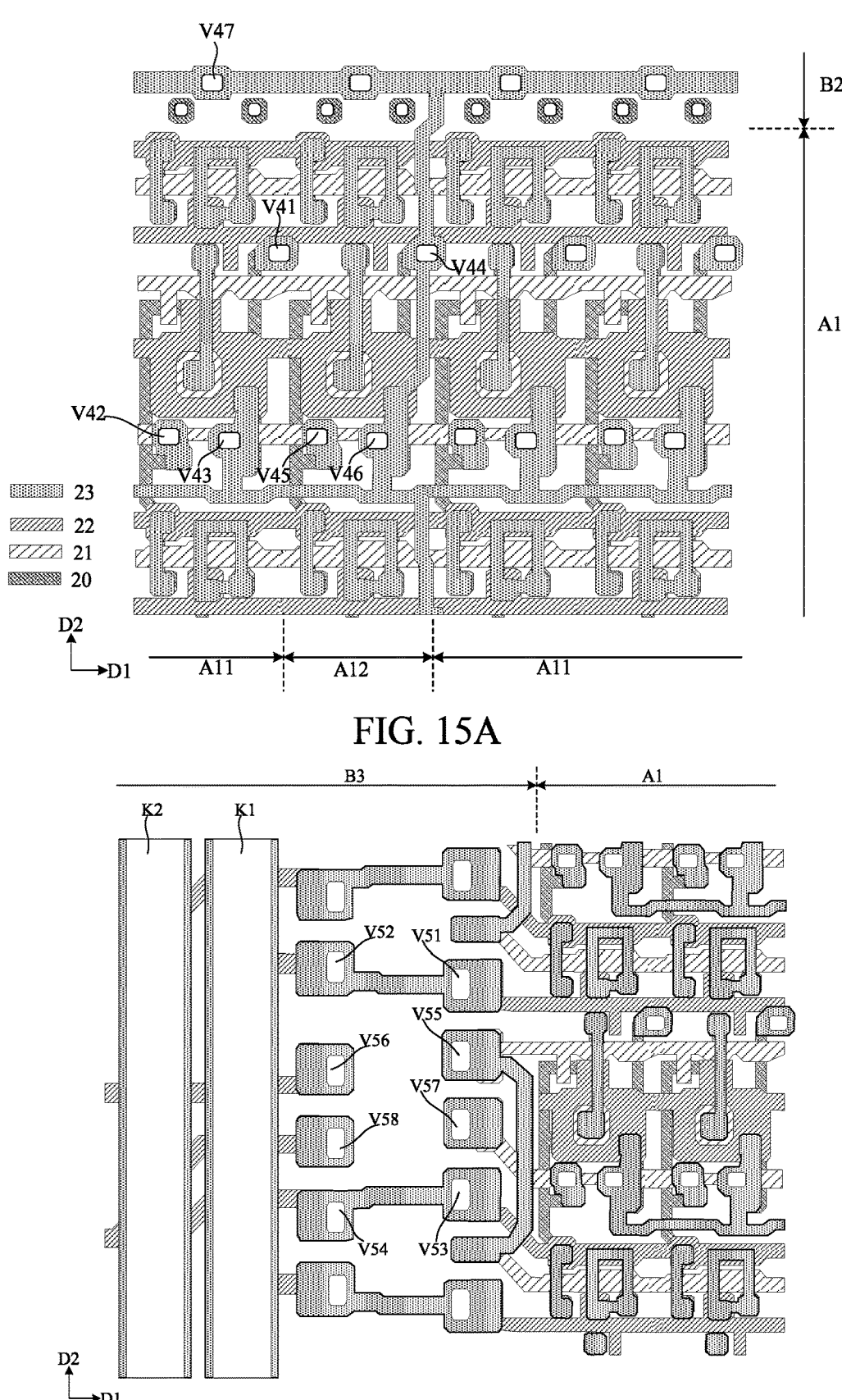
FIG. 15A is a schematic diagram of the circuit structure layer after a fifth insulation layer is formed in FIG. 5.
FIG. 15B is a schematic diagram of the circuit structure layer after a fifth insulation layer is formed in FIG. 7.
Figures 15C, 16A:
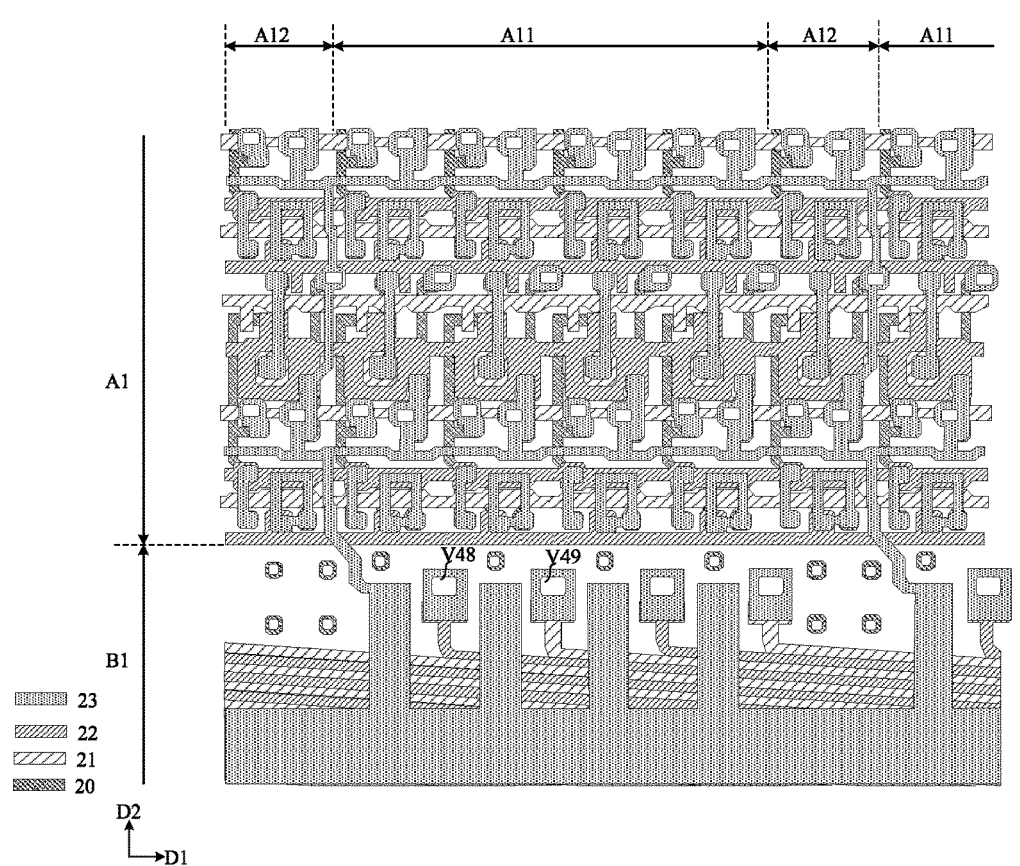

FIG. 15C is a schematic diagram of the circuit structure layer after a fifth insulation layer is formed in FIG. 8.

Figures 5, 6:
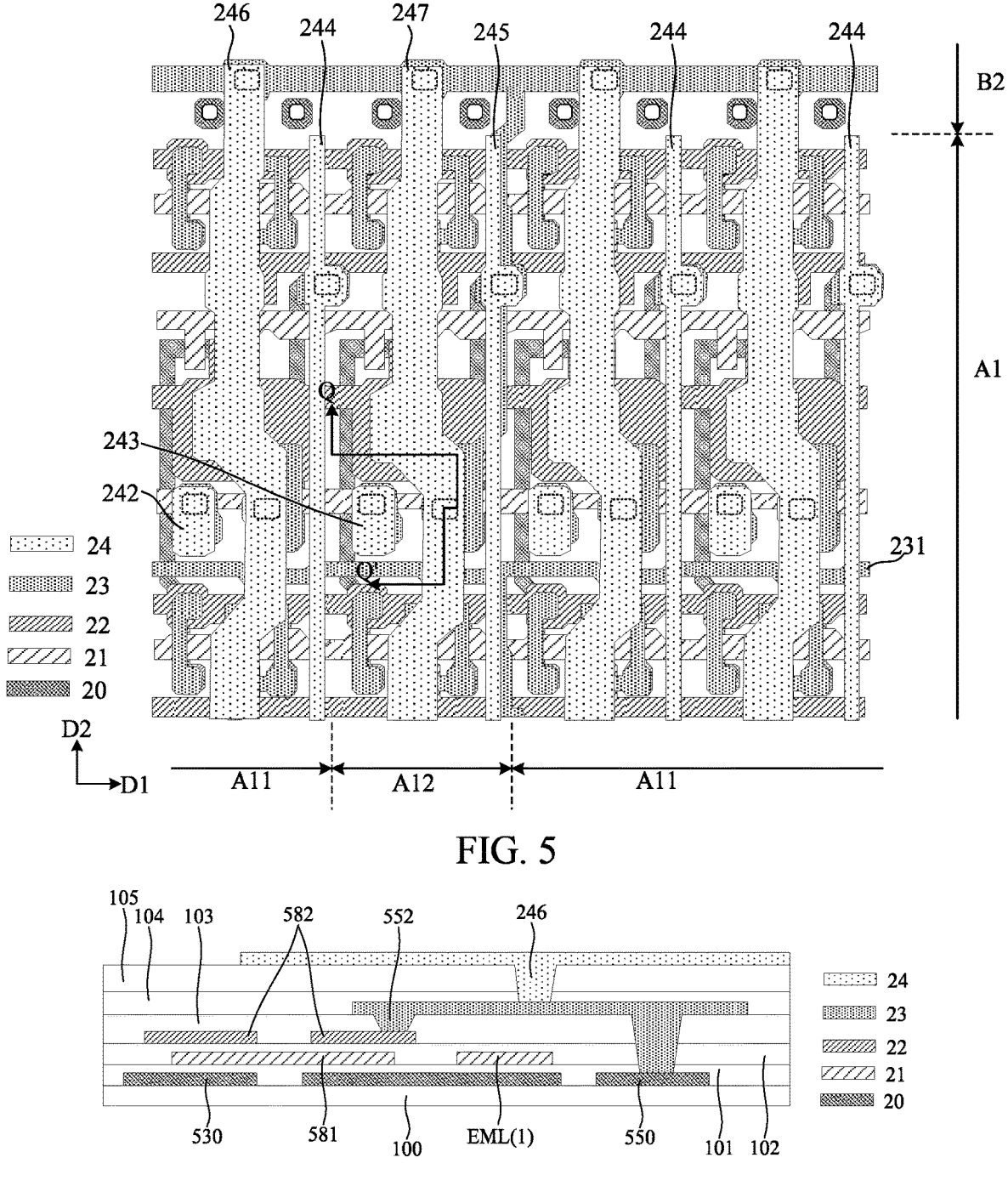
FIG. 5 is a partial enlarged schematic diagram of a circuit structure layer of a region S1 in FIG. 4.
FIG. 6 is a partial cross-sectional schematic diagram along a Q-Q' direction in FIG. 5.

FIG. 16A is another partial enlarged schematic diagram of a circuit structure layer of a region S2 in FIG. 5.

Figure 16B:
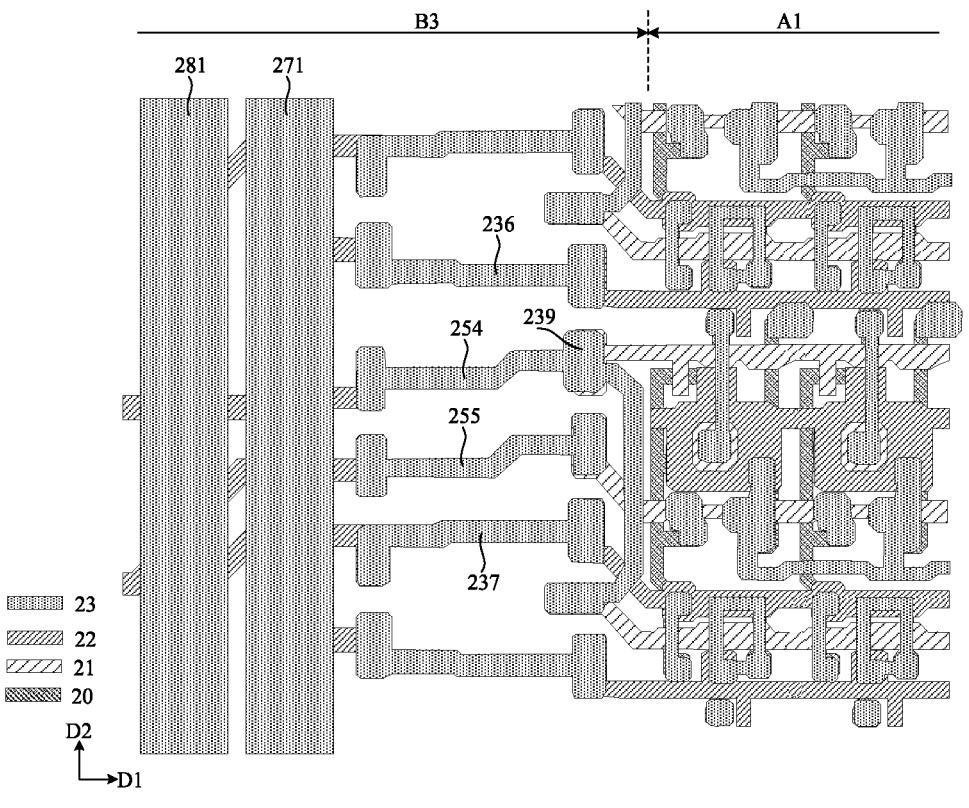

FIG. 16B is a schematic diagram of the circuit structure layer after a third conductive layer is formed in FIG. 16A.

Figure 17:
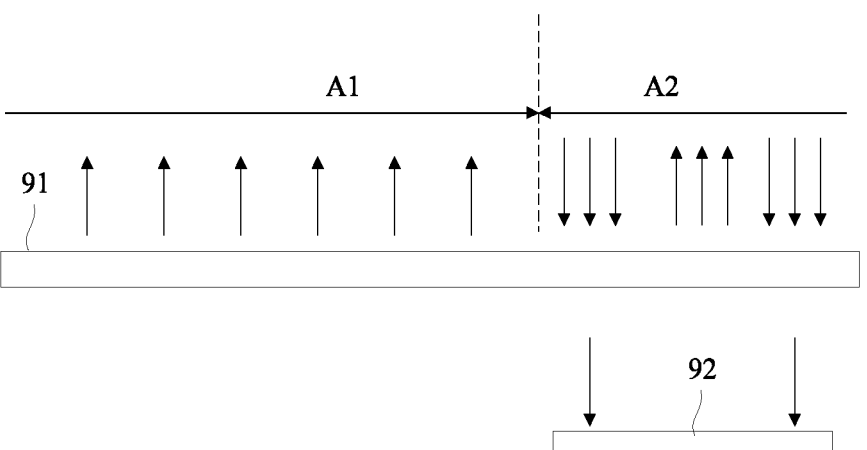

FIG. 17 is a schematic diagram of a display apparatus according to at least one embodiment of the present disclosure.

DETAILED DESCRIPTION

The embodiments of the present disclosure will be described below in combination with the drawings in detail. Implementation modes may be implemented in a plurality of different forms. Those of ordinary skill in the art may easily understand such a fact that manners and contents may be transformed into other forms without departing from the purpose and scope of the present disclosure. Therefore, the present disclosure should not be explained as being limited to contents described in following implementation modes only. The embodiments in the present disclosure and features in the embodiments may be combined randomly with each other without conflict.

In the drawings, a size of one or more constituent elements, a thickness of a layer, or a region is sometimes exaggerated for clarity. Therefore, one mode of the present disclosure is not necessarily limited to the size, and a shape and a size of one or more components in the drawings do not reflect a true proportion. In addition, the drawings schematically illustrate ideal examples, and one mode of the present disclosure is not limited to shapes, numerical values, or the like shown in the drawings.

Ordinal numerals such as "first", "second", and "third" in the specification are set to avoid confusion of constituent elements, but not to set a limit in quantity. In the present disclosure, "plurality" represents two or more than two.

In the specification, for convenience, wordings indicating orientation or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements are changed as appropriate according to a direction where the constituent elements are described. Therefore, appropriate replacements may be made according to situations without being limited to the wordings described in the specification.

In the specification, unless otherwise specified and defined explicitly, terms "mount", "mutually connect", and "connect" should be understood in a broad sense. For example, it may be a fixed connection, a detachable connection, or an integrated connection; it may be a mechanical connection or a connection; it may be a direct connection, an indirect connection through an intermediate component, or communication inside two components. Those of ordinary skills in the art may understand meanings of the above-mentioned terms in the present disclosure according to situations.

In the specification, an "electrical connection" includes a case that constituent elements are connected together through an element having some electrical function. The "element having some electrical function" is not particularly limited as long as electrical signals between the connected constituent elements may be transmitted. Examples of the "element having some electrical function" not only include an electrode and a wiring, but also include a switching element such as a transistor, a resistor, an inductor, a capacitor, another element with a plurality of functions, etc.

In the specification, a transistor refers to an element which at least includes three terminals, i.e., a gate electrode, a drain electrode, and a source electrode. The transistor has a channel region between the drain electrode (drain electrode terminal, drain region, or drain) and the source electrode (source electrode terminal, source region, or source), and a current can flow through the drain electrode, the channel region, and the source electrode. In the specification, the channel region refers to a region through which a current mainly flows.

In the specification, a first electrode may be a drain electrode and a second electrode may be a source electrode, or, a first electrode may be a source electrode and a second electrode may be a drain electrode. In a case that transistors with opposite polarities are used, or in a case that a direction of a current is changed during work of a circuit, or the like, functions of the "source electrode" and the "drain electrode" may sometimes be exchangeable. Therefore, the "source electrode" and the "drain electrode" may be exchangeable in the specification. In addition, the gate electrode may also be referred to as a control electrode.

In the specification, "parallel" refers to a state in which an angle formed by two straight lines is above −10° and below 10°, and thus also includes a state in which the angle is above −5° and below 5°. In addition, "perpendicular" refers to a state in which an angle formed by two straight lines is above 80° and below 100°, and thus also includes a state in which the angle is above 85° and below 95°.

A triangle, rectangle, trapezoid, pentagon, or hexagon, etc. in this specification is not strictly defined, and it may be an approximate triangle, rectangle, trapezoid, pentagon, or hexagon, etc. There may be some small deformation caused by tolerance, and there may be a chamfer, an arc edge, and deformation, etc.

A "light transmission rate" in the present disclosure refers to an ability of light to pass through a medium, and is a percentage of luminous flux passing through a transparent or translucent body to its incident luminous flux.

In the present disclosure, "about" and "substantially" refer to that a boundary is not defined strictly and a case within a range of a process and measurement error is allowed. In the present disclosure, "substantially the same" refers to a case where values differ by less than 10%.

Static electricity will be generated in a process procedure of a pixel circuit of a display substrate, due to an antenna effect (for example, an exposed metal wire or a conductor such as polysilicon, just like an antenna, will collect electric charges (such as charged particles generated by plasma etching), resulting in an increase in a potential), static electricity tends to accumulate in long wires, resulting in a risk of Electro-Static Discharge (ESD) in a display region. There is a serious ESD problem in a production process procedure of a pixel circuit of a display substrate using the Full display with camera technology, which will lead to a large loss of a yield.

An embodiment of the present disclosure provides a display substrate including a base substrate, a circuit structure layer disposed on the base substrate, and a light emitting structure layer located on a side of the circuit structure layer away from the base substrate. The base substrate includes a display region and a peripheral region located at a periphery of the display region. The display region may include a first display region and a second display region. The first display region at least partially surrounds the second display region. The circuit structure layer may include a plurality of pixel circuits located in the first display region, at least one first trace extending along a first direction, at least one second trace extending along a second direction, and at least one third trace located in the peripheral region. The light emitting structure layer may include a plurality of first light emitting elements located in the first display region and a plurality of second light emitting elements located in the second display region. The plurality of pixel circuits may include a plurality of first pixel circuits and a plurality of second pixel circuits. At least one first pixel circuit in the plurality of first pixel circuits is electrically connected with at least one first light emitting element in the plurality of first light emitting elements of the first display region, at least one second pixel circuit in the plurality of second pixel circuits is electrically connected with at least one second light emitting element in the plurality of second light emitting elements of the second display region. At least one first trace and at least one second trace of the first display region are electrically connected. At least one third trace is electrically connected with at least one of following: at least one first trace and at least one second trace. Herein, the first direction and the second direction intersect. For example, the first direction and the second direction may be perpendicular to each other.

In some examples, at least one third trace may be electrically connected with at least one second trace. For example, at least one third trace may extend along the first direction in the peripheral region. Or, at least one third trace may be electrically connected with at least one first trace. For example, at least one third trace may extend along the second direction within the peripheral region. Or, at least one third trace may be electrically connected with at least one first trace and at least one second trace at the same time. However, this embodiment is not limited thereto.

In the present disclosure, "A extends along a B direction" means that A may include a main body portion and a secondary portion connected with the main body portion, the main body portion is a line, a line segment, or a strip-shaped body, the main body portion extends along the B direction, and a length of the main body portion extending along the B direction is greater than a length of the secondary portion extending along another direction. In following description, "A extends along a B direction" means "a main body portion of A extends along a B direction".

In the display substrate according to this embodiment, a first trace and a second trace which are electrically connected with each other are disposed in the first display region, and a second trace is electrically connected with a third trace in the peripheral region, so that an static electricity lead-out path from the display region to the peripheral region may be established through the first trace and the second trace, which may be beneficial to leading out static electricity generated in a process procedure of the display substrate from the display region, thereby effectively reducing an ESD risk of the display region.

In some examples, at least one third trace and at least one second trace may be disposed in a same layer. For example, at least one third trace and at least one second trace may be of an integral structure. For another example, a third trace may be a double-layer trace, in which one sub-trace and a second trace may be disposed in a same layer. In other examples, at least one third trace and at least one first trace may be disposed in a same layer. In other examples, at least one third trace, at least one first trace, and at least one second trace may be disposed in a same layer.

In some examples, a first trace and a second trace may be disposed in a same layer. However, this embodiment is not limited thereto. In other examples, a first trace and a second trace may be located in different conductive layers, and electrically connected through a via disposed in an insulation layer.

In some exemplary implementation modes, at least one first trace and at least one second trace may be of an integral structure. For example, at least one first trace and at least one second trace of the first display region may be electrically connected with to form a mesh connection structure.

In some exemplary implementation modes, the plurality of pixel circuits of the first display region may further include a plurality of invalid pixel circuits, and an orthographic projection of at least one second trace on the base substrate is overlapped with an orthographic projection of at least one invalid pixel circuit on the base substrate. In this example, second traces may be arranged in a region where the invalid pixel circuit is located, which may avoid occupying space of a valid pixel circuit and support extension of the second traces in the second direction.

In some exemplary implementation modes, an orthographic projection of at least one first trace on the base substrate may be located between two adjacent rows of pixel circuits. An arrangement manner of first traces of this example may avoid occupying space of a valid pixel circuit and may support extension of first traces in the first direction.

In some exemplary implementation modes, the peripheral region may include a first bezel region and a second bezel region located on opposite sides of the display region along the second direction. At least one third trace may include a first power supply line located in the first bezel region and a first power connection line located in the second bezel region. At least one second trace may be electrically connected with at least one of the first power connection line and the first power supply line. In some examples, the at least one second trace may be electrically connected directly with the first power connection line, for example, they may be of an integral structure. The first power supply line and the first power connection line may extend along the first direction. The second trace is electrically connected with the first power supply line in the first bezel region, and electrically connected with the first power connection line in the second bezel region, which may provide a plurality of paths for static electricity to be led out and is beneficial for static electricity to be led out from the display region.

In other examples, a third trace may be another long wire in the peripheral region. For example, the third trace may include a second power supply line. In other examples, the peripheral region may include a third bezel region and a fourth bezel region located on opposite sides of the display region along the first direction, the third trace may be located in the third bezel region and the fourth bezel region, and at least one first trace may extend to the third bezel region and the fourth bezel region to be electrically connected with the third trace. In other examples, the third trace may be located in the first bezel region, the second bezel region, the third bezel region, and the fourth bezel region, in the first bezel region and the second bezel region, the third trace is electrically connected with at least one second trace, and in the third bezel region and the fourth bezel region, the third trace may be electrically connected with at least one first trace. In this example, through electrical connections of a first trace, a second trace, and a third trace, a lead-out path may be provided for static electricity of the display region during a process preparation, thus improving a product preparation yield.

In some exemplary implementation modes, the first power supply line may include a first sub-power supply line and a second sub-power supply line stacked and electrically connected with each other. At least one second trace, the first power connection line, and the first sub-power supply line may be of an integral structure. In this example, the first power supply line may be of a double-layer trace structure. However, this embodiment is not limited thereto.

In some exemplary implementation modes, in a direction perpendicular to the display substrate, the circuit structure layer of the first display region may include a semiconductor layer, a first conductive layer, a second conductive layer, and a third conductive layer disposed on the base substrate. The semiconductor layer at least may include an active layer of a transistor of at least one pixel circuit. The first conductive layer at least may include a gate of a transistor of at least one pixel circuit and a first capacitor plate of a storage capacitor. The second conductive layer at least may include a second capacitor plate of a storage capacitor of at least one pixel circuit. The third conductive layer at least may include a first trace and a second trace. In this example, by disposing the first trace and the second trace in the third conductive layer, static electricity generated in the process procedure of the display substrate and accumulated in the first conductive layer and the second conductive layer may be led out from the display region to avoid damaging a transistor in the first display region.

In some exemplary implementation modes, the circuit structure layer of the first display region may further include a fourth conductive layer located on a side of the third conductive layer away from the base substrate. The fourth conductive layer at least may include a data line, a dummy data line, and a first power supply transmission line. The data line may be electrically connected with a plurality of first pixel circuits or a plurality of second pixel circuits. The first power supply transmission line is electrically connected with a plurality of pixel circuits. The dummy data line is electrically connected with a second trace. Both the dummy data line and the first power supply transmission line are electrically connected with a third trace. In this example, the second trace may also be electrically connected with the first power supply line through the dummy data line, which may provide a static electricity lead-out path in the fourth conductive layer.

In some exemplary implementation modes, the second conductive layer may further include a first initial signal line and a second initial signal line. The first initial signal line and the second initial signal line each extend along the first direction. The peripheral region may further include a first initial peripheral trace and a second initial peripheral trace. The first initial peripheral trace and the second initial peripheral trace extend along the second direction. The first initial signal line may be electrically connected with the first initial peripheral trace through a first initial transfer line; the second initial signal line may be electrically connected with the second initial peripheral trace through a second initial transfer line. The first initial transfer line and the second initial transfer line may be located in the third conductive layer. In this example, signal transfer is performed using the first initial transfer line and the second initial transfer line of the third conductive layer, which may be beneficial to lead static electricity accumulated in the second conductive layer out of the display region.

In some exemplary implementation modes, the first conductive layer may further include a scan line and a light emitting control line extending along the first direction. The peripheral region further includes a scan output line and a light emitting control output line. The scan line may be electrically connected with the scan output line through a scan transfer line. The light emitting control line may be electrically connected with the light emitting control output line through a light emitting control transfer line. The scan transfer line and the light emitting control transfer line may be located in the third conductive layer. In this example, signal transfer is performed using the scan transfer line and the light emitting control transfer line of the third conductive layer, which may be beneficial to lead static electricity accumulated in the first conductive layer out of the display region.

Solutions of the embodiments will be described below through some examples.

Figure 1:
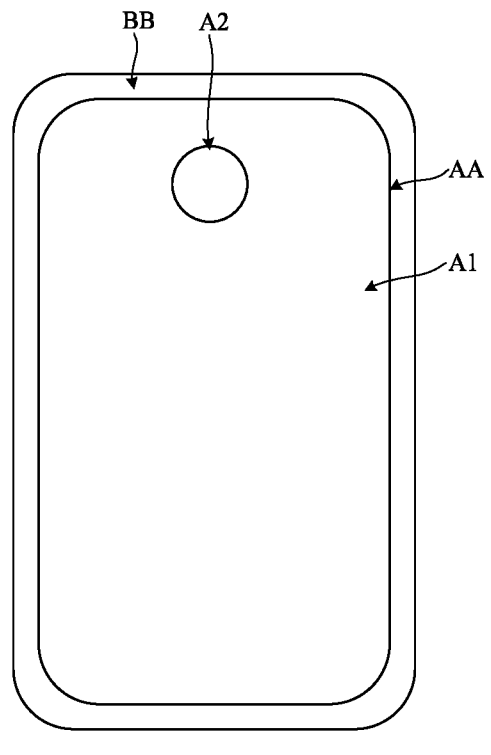
FIG. 1 is a schematic diagram of a display substrate according to at least one embodiment of the present disclosure.

FIG. 1 is a schematic diagram of a display substrate according to at least one embodiment of the present disclosure. In some examples, as shown in FIG. 1, the display substrate may include a display region AA and a peripheral region BB located at a periphery of the display region AA. The display region AA of the display substrate may include a first display region A1 and a second display region A2. The first display region A1 at least partially surrounds the second display region A2. In this example, the first display region A1 may surround the second display region A2.

In some examples, as shown in FIG. 1, the second display region A2 may be a light-transmitting display region and may also be referred to as a Full Display with Camera (FDC) region; the first display region A1 may be a normal display region. For example, an orthographic projection of a photosensitive sensor (such as a camera and other hardware) on the display substrate may be located in the second display region A2 of the display substrate. In some examples, as shown in FIG. 1, the second display region A2 may be circular and a size of the orthographic projection of the photosensitive sensor on the display substrate may be less than or equal to a size of the second display region A2. However, this embodiment is not limited thereto. In other examples, the second display region A2 may be rectangular, and a size of the orthographic projection of the photosensitive sensor on the display substrate may be less than or equal to a size of an inscribed circle of the second display region A2.

In some examples, as shown in FIG. 1, the second display region A2 may be located in a middle position of a top of the display region AA. The first display region A1 may surround the second display region A2. However, this embodiment is not limited thereto. For example, the second display region A2 may be located in another position such as an upper left corner or an upper right corner of the display region AA. For example, the first display region A1 may surround at least one side of the second display region A2.

In some examples, as shown in FIG. 1, the display region AA may have a shape of a rectangle, e.g., a rounded rectangle. The second display region A2 may be circular or elliptical. However, this embodiment is not limited thereto. For example, the second display region A2 may be rectangular, semi-circular, pentagonal, or have another shape.

In some examples, the display region AA is provided with a plurality of sub-pixels. At least one sub-pixel may include a pixel circuit and a light emitting element. The pixel circuit is configured to drive a connected light emitting element. For example, the pixel circuit is configured to provide a drive current to drive the light emitting element to emit light. The pixel circuit may include a plurality of transistors and at least one capacitor. For example, the pixel circuit may be of a 3T1C (i.e., three transistors and one capacitor) structure, a 7T1C (i.e., seven transistors and one capacitor) structure, a 5T1C (i.e., five transistors and one capacitor) structure, an 8T1C (i.e., eight transistors and one capacitor) structure, or an 8T2C (i.e., eight transistors and two capacitors) structure, etc.

In some examples, the light emitting element may be any of a Light Emitting Diode (LED), an Organic Light Emitting Diode (OLED), a Quantum dot Light Emitting Diode (QLED), a micro LED (including: mini-LED or micro-LED), and the like. For example, the light emitting element may be an OLED, and the light emitting element may emit red light, green light, blue light, or white light, etc. under drive of its corresponding pixel circuit. A color of light emitted from the light emitting element may be determined as required. In some examples, the light emitting element may include an anode, a cathode, and an organic emitting layer disposed between the anode and the cathode. The anode of the light emitting element may be electrically connected with a corresponding pixel circuit. However, this embodiment is not limited thereto.

In some examples, one pixel unit in the display region may include three sub-pixels, which may be a red sub-pixel, a green sub-pixel, and a blue sub-pixel respectively. However, this embodiment is not limited thereto. In some examples, one pixel unit may include four sub-pixels, which may be a red sub-pixel, a green sub-pixel, a blue sub-pixel, and a white sub-pixel respectively.

In some examples, a shape of the light emitting element may be a rectangle, a rhombus, a pentagon, or a hexagon. When one pixel unit includes three sub-pixels, light emitting elements of the three sub-pixels may be arranged side by side horizontally, side by side vertically, or in a manner like a Chinese character " 品 ". When one pixel unit includes four sub-pixels, light emitting elements of the four sub-pixels may be arranged side by side horizontally, side by side vertically, or in a manner to form a square. However, this embodiment is not limited thereto.

Figure 2:
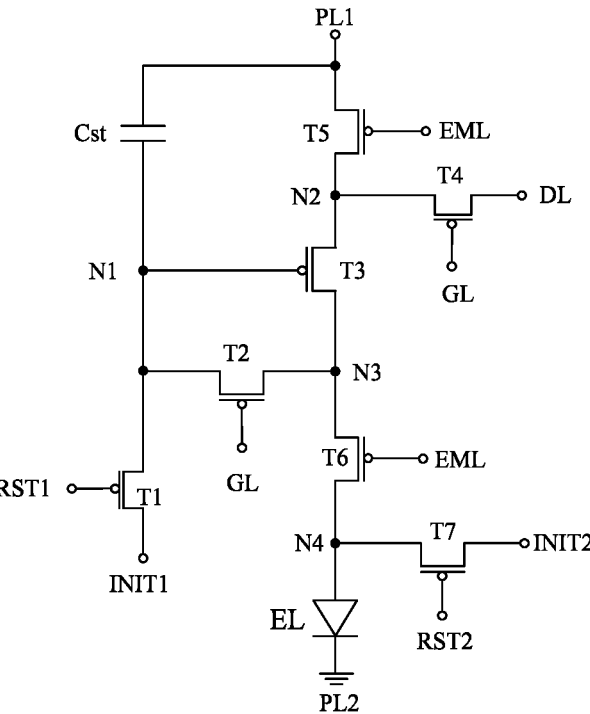
FIG. 2 is an equivalent circuit diagram of a pixel circuit according to at least one embodiment of the present disclosure.

FIG. 2 is an equivalent circuit diagram of a pixel circuit according to at least one embodiment of the present disclosure. The pixel circuit of the exemplary embodiment is described by taking a 7T1C structure as an example. However, this embodiment is not limited thereto.

In some exemplary implementation modes, as shown in FIG. 2, the pixel circuit of this example may include six switching transistors (T1, T2, and T4 to T7), one drive transistor T3, and one storage capacitor Cst. The six switching transistors may be respectively a data writing transistor T4, a threshold compensation transistor T2, a first light emitting control transistor T5, a second light emitting control transistor T6, a first reset transistor T1, and a second reset transistor T7. The light emitting element EL may include an anode, a cathode, and an organic emitting layer disposed between the anode and the cathode.

In some exemplary implementation modes, the drive transistor and the six switching transistors may be P-type transistors or may be N-type transistors. Using a same type of transistors in a pixel circuit may simplify a process flow, reduce a process difficulty of a display substrate, and improve a yield of products. In some exemplary implemen-tation modes, the drive transistor and the six switching transistors may include a P-type transistor and an N-type transistor.

In some exemplary implementation modes, Low Temperature Poly Silicon thin film transistors, or oxide thin film transistors, or a Low Temperature Poly Silicon thin film transistor and an oxide thin film transistor may be adopted for the drive transistor and the six switching transistors. An active layer of a Low Temperature Poly Silicon thin film transistor is made of Low Temperature Poly Silicon (LTPS), and an active layer of an oxide thin film transistor is made of an oxide semiconductor (Oxide). A Low-temperature Poly Silicon thin film transistor has advantages such as a high mobility rate and fast charging, while an oxide thin film transistor has an advantage such as a low leakage current. The Low Temperature Poly Silicon thin film transistor and the oxide thin film transistor are integrated on one display substrate to form a Low Temperature Polycrystalline Oxide (LTPO) display substrate, and advantages of both the Low Temperature Poly Silicon thin film transistor and the oxide thin film transistor may be utilized, which may achieve low-frequency drive, reduce power consumption, and improve display quality.

In some exemplary implementation modes, as shown in FIG. 2, a display substrate may include a scan line GL, a data line DL, a first power supply line PL1, a second power supply line PL2, a light emitting control line EML, a first initial signal line INIT1, a second initial signal line INIT2, a first reset control line RST1, and a second reset control line RST2. In some examples, the first power supply line PL1 may be configured to provide a constant first voltage signal VDD to a pixel circuit, the second power supply line PL2 is configured to provide a constant second voltage signal VSS to the pixel circuit, and the first voltage signal VDD is greater than the second voltage signal VSS. The scan line GL may be configured to provide a scan signal SCAN to the pixel circuit, the data line DL may be configured to provide a data signal DATA to the pixel circuit, the light emitting control line EML may be configured to provide a light emitting control signal EM to the pixel circuit, the first reset control line RST1 may be configured to provide a first reset control signal RESET1 to the pixel circuit, and the second reset control line RST2 may be configured to provide a second reset control signal RESET2 to the pixel circuit. In some examples, in a pixel circuit of an n-th row, a first reset control line RST1 may be electrically connected with a scan line GL of a pixel circuit of an (n–1)-th row to be inputted with a scan signal SCAN(n–1), that is, a first reset control signal RESET1($n$) is the same as the scan signal SCAN(n–1). A second reset control line RST2 may be electrically connected with a scan line GL of the pixel circuit of the n-th row to be inputted with a scan signal SCAN(n), that is, a second reset control signal RESET2($n$) is the same as the scan signal SCAN(n). In some examples, a second reset control line RST2 with which the pixel circuit of the n-th row is electrically connected and a first reset control line RST1 with which the pixel circuit of the (n+1)-th row is electrically connected may have an integral structure. Herein, n is an integer greater than 0. In this way, signal lines of the display substrate may be reduced, and a design of a narrow bezel of the display substrate may be achieved. However, this embodiment is not limited thereto.

In some exemplary implementation modes, the first initial signal line INIT1 may be configured to provide a first initial signal to the pixel circuit, the second initial signal line INIT2 may be configured to provide a second initial signal to the pixel circuit. For example, the first initial signal may be different from the second initial signal. The first initial signal and the second initial signal may be constant voltage signals, and their magnitudes may be between the first voltage signal VDD and the second voltage signal VSS, but are not limited to this. In other examples, the first initial signal and the second initial signal may be the same, and only the first initial signal line may be set to provide the first initial signal.

In some exemplary implementation modes, as shown in FIG. 2, the drive transistor T3 is electrically connected with the light emitting element EL, and outputs a drive current to drive the light emitting element EL to emit light under control of the scan signal SCAN, the data signal DATA, the first voltage signal VDD, and the second voltage signal VSS, etc. A gate of the data writing transistor T4 is electrically connected with a scan line GL, a first electrode of the data writing transistor T4 is electrically connected with a data line DL, and a second electrode of the data writing transistor T4 is electrically connected with a first electrode of the drive transistor T3. A gate of the threshold compensation transistor T2 is electrically connected with a scan line GL, a first electrode of the threshold compensation transistor T2 is electrically connected with a gate of the drive transistor T3, and a second electrode of the threshold compensation transistor T2 is electrically connected with a second electrode of the drive transistor T3. A gate of the first light emitting control transistor T5 is electrically connected with a light emitting control line EML, a first electrode of the first light emitting control transistor T5 is electrically connected with a first power supply line PL1, and a second electrode of the first light emitting control transistor T5 is electrically connected with the first electrode of the drive transistor T3. A gate of the second light emitting control transistor T6 is electrically connected with a light emitting control line EML, a first electrode of the second light emitting control transistor T6 is electrically connected with the second electrode of the drive transistor T3, and a second electrode of the second light emitting control transistor T6 is electrically connected with an anode of the light emitting element EL. The first reset transistor T1 is electrically connected with the gate of the drive transistor T3 and configured to reset the gate of the drive transistor T3, and the second reset transistor T7 is electrically connected with the anode of the light emitting element EL and configured to reset the anode of the light emitting element EL. A gate of the first reset transistor T1 is electrically connected with a first reset control line RST1, a first electrode of the first reset transistor T1 is electrically connected with a first initial signal line INIT1, and a second electrode of the first reset transistor T1 is electrically connected with the gate of the drive transistor T3. A gate of the second reset transistor T7 is electrically connected with a second reset control line RST2, a first electrode of the second reset transistor T7 is electrically connected with a second initial signal line INIT2, and a second electrode of the second reset transistor T7 is electrically connected with the anode of the light emitting element EL. A first capacitor plate of the storage capacitor Cst is electrically connected with the gate of the drive transistor T3, and a second capacitor plate of the storage capacitor Cst is electrically connected with the first power supply line PL1.

In this example, a first node N1 is a connection point of the storage capacitor Cst, the first reset transistor T1, the drive transistor T3, and the threshold compensation transistor T2, a second node N2 is a connection point of the first light emitting control transistor T5, the data writing transistor T4, and the drive transistor T3, a third node N3 is a connection point of the drive transistor T3, the threshold compensation transistor T2, and the second light emitting control transistor T6, and a fourth node N4 is a connection point of the second light emitting control transistor T6, the second reset transistor T7, and the light emitting element EL.

A working process of the pixel circuit is explained below. Description is given by taking a case in which multiple transistors included in the pixel circuit shown in FIG. 2 are all P-type transistors as an example.

In some exemplary implementation modes, during one-frame display time period, the working process of the pixel circuit may include a first stage, a second stage, and a third stage.

The first stage is referred to as a reset stage. A first reset control signal RESET1 provided by the first reset control line RST1 is a low-level signal, so that the first reset transistor T1 is turned on, and a first initial signal provided by the first initial signal line INIT1 is provided to the first node N1 to initialize the first node N1 and clear an original data voltage in the storage capacitor Cst. A scan signal SCAN provided by the scan line GL is a high-level signal, and a light emitting control signal EM provided by the light emitting control line EML is a high-level signal, so that the data writing transistor T4, the threshold compensation transistor T2, the first light emitting control transistor T5, the second light emitting control transistor T6, and the second reset transistor T7 are turned off. In this stage, the light emitting element EL does not emit light.

The second stage is referred to as a data writing stage or a threshold compensation stage. A scan signal SCAN provided by the scan line GL is a low-level signal, a first reset control signal RESET1 provided by the first reset control line RST1 and a light emitting control signal EM provided by the light emitting control line EML are both high-level signals, and the data line DL outputs a data signal DATA. In this stage, since the first capacitor plate of the storage capacitor Cst is at a low level, the drive transistor T3 is turned on. The scan signal SCAN is the low-level signal, so that the threshold compensation transistor T2, the data writing transistor T4, and the second reset transistor T7 are turned on. The threshold compensation transistor T2 and the data writing transistor T4 are turned on, so that a data voltage Vdata output by the data line DL is provided to the first node N1 through the second node N2, the turned-on drive transistor T3, the third node N3, and the turned-on threshold compensation transistor T2, and the storage capacitor Cst is charged with a difference between the data voltage Vdata output by the data line DL and a threshold voltage of the drive transistor T3. A voltage of the first capacitor plate (that is, the first node N1) of the storage capacitor Cst is Vdata−|Vth|, wherein Vdata is the data voltage output by the data line DL, and Vth is the threshold voltage of the drive transistor T3. The second reset transistor T7 is turned on, so that a second initial signal provided by the second initial signal line INIT2 is provided to the anode of the light emitting element EL to initialize (reset) the anode of the light emitting element EL and clear a pre-stored voltage therein, so as to complete initialization, thereby ensuring that the light emitting element EL does not emit light. The first reset control signal RESET1 provided by the first reset control line RST1 is a high-level signal, so that the first reset transistor T1 is turned off. The light emitting control signal EM provided by the light emitting control signal line EML is a high-level signal, so that the first light emitting control transistor T5 and the second light emitting control transistor T6 are turned off.

The third stage is referred to as a light emitting stage. A light emitting control signal EM provided by the light emitting control signal line EML is a low-level signal, and a scan signal SCAN provided by the scan line GL and a first reset control signal RESET1 provided by the first reset control line RST1 are high-level signals. The light emitting control signal EM provided by the light emitting control signal line EML is the low-level signal, so that the first light emitting control transistor T5 and the second light emitting control transistor T6 are turned on, and a first voltage signal VDD output by the first power supply line PL1 provides a drive voltage to the anode of the light emitting element EL through the turned-on first light emitting control transistor T5, the drive transistor T3, and the second light emitting control transistor T6 to drive the light emitting element EL to emit light.

In a drive process of the pixel circuit, a drive current flowing through the drive transistor T3 is determined by a voltage difference between the gate and the first electrode of the drive transistor T3. Since the voltage of the first node N1 is Vdata-|Vth|, the drive current of the drive transistor T3 is as follows.

$$I = K \times (Vgs - Vth)^2 =$$
$$K \times [(VDD - Vdata + |Vth|) - Vth]^2 = K \times [VDD - Vdata]^2$$

Among them, I is the drive current flowing through the drive transistor T3, that is, the drive current for driving the light emitting element EL; K is a constant; Vgs is the voltage difference between the gate and the first electrode of the drive transistor T3; Vth is the threshold voltage of the drive transistor T3; Vdata is the data voltage output by the data line DL; and VDD is the first voltage signal output by the first power supply line PL1.

It may be seen from the above formula that a current flowing through the light emitting element EL has nothing to do with the threshold voltage of the drive transistor T3. Therefore, the pixel circuit of this embodiment may better compensate the threshold voltage of the drive transistor T3.

Figure 3:
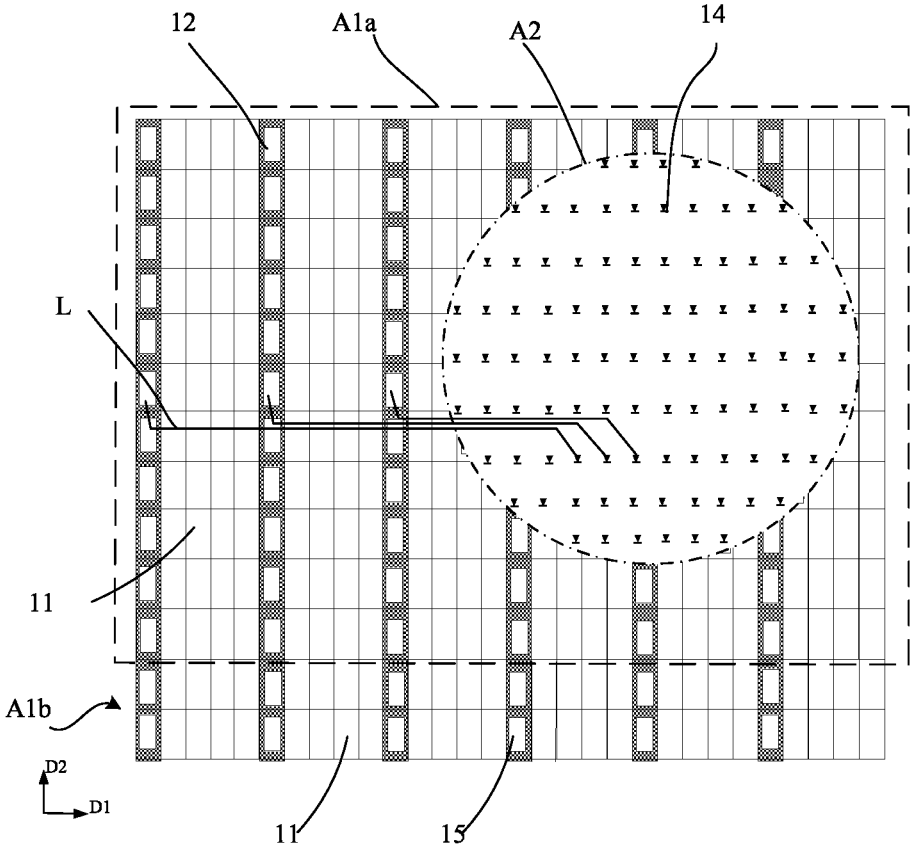
FIG. 3 is a partial schematic diagram of a display substrate according to at least one embodiment of the present disclosure.

FIG. 3 is a partial schematic diagram of a display substrate according to at least one embodiment of the present disclosure. In some examples, as shown in FIG. 3, the first display region A1 of the display substrate may include a transition region A1a and a non-transition region A1b. The transition region A1a may be located on at least one side outside the second display region A2 (for example, one side; for another example, all around, i.e., including upper and lower sides and left and right sides).

In some examples, the second display region A2 may include a plurality of second light emitting elements 14 arranged in an array. The transition region A1a may include a plurality of first pixel circuits 11 and a plurality of second pixel circuits 12 arranged in an array and may also include a plurality of first light emitting elements. At least one first pixel circuit 11 within the transition region A1a may be electrically connected with at least one first light emitting element, and configured to drive the first light emitting element to emit light. An orthographic projection of the first light emitting element on the base substrate may be at least partially overlapped with an orthographic projection of the electrically connected first pixel circuit 11 on the base substrate. At least one second pixel circuit 12 may be electrically connected with at least one second light emitting element 14 disposed within the second display region A2 through a conductive line L (e.g., a transparent conductive line) and configured to drive the second light emitting element 14 to emit light. For example, one end of the conductive line L may be electrically connected with the second pixel circuit 12 and the other end may be electrically connected with the second light emitting element 14, and the conductive line L may extend from the transition region A1a to the second display region A2. An orthographic projection of the second pixel circuit 12 on the base substrate may not be overlapped with an orthographic projection of the electrically connected second light emitting element 14 on the base substrate. In this example, each second light emitting element 14 in the second display region A2 may be electrically connected with a second pixel circuit 12 within the transition region A1a through at least one conductive line L. By disposing the second pixel circuit 12 for driving the second light emitting element 14 in the transition region A1a, shielding of light by the pixel circuit may be reduced, thereby increasing a light transmittance of the second display region A2.

In some examples, the conductive line L may be made of a transparent conductive material, for example, may be made of a conductive oxide material, such as Indium Tin Oxide (ITO). However, this embodiment is not limited thereto.

In some examples, as shown in FIG. 3, the non-transition region A1b may include a plurality of first pixel circuits 11 and a plurality of invalid pixel circuits 15 arranged in an array, and may also include a plurality of first light emitting elements. At least one first pixel circuit 11 within the non-transition region A1b may be electrically connected with at least one first light emitting element, and an orthographic projection of the first light emitting element on the base substrate may be at least partially overlapped with an orthographic projection of the electrically connected first pixel circuit 11 on the base substrate.

In some examples, as shown in FIG. 3, the transition region A1a and the non-transition region A1b may also include a plurality of invalid pixel circuits 15. It may be beneficial to improve uniformity of components of a plurality of film layers in an etching process by disposing an invalid pixel circuit. For example, a structure of the invalid pixel circuit may be substantially the same as that of a first pixel circuit and a second pixel circuit of a row or column in which the invalid pixel circuit is located, except that it is not electrically connected with any light emitting element.

In some examples, since the first display region A1 is provided with not only a first pixel circuit electrically connected with a first light emitting element, but also a second pixel circuit electrically connected with a second light emitting element, a quantity of pixel circuits of the first display region A1 may be greater than a quantity of first light emitting elements. In some examples, as shown in FIG. 3, a region where newly added pixel circuits (including a second pixel circuit and an invalid pixel circuit) are disposed may be obtained by reducing a size of a first pixel circuit 11 in a first direction D1. For example, a size of a pixel circuit in the first direction D1 may be smaller than a size of a first light emitting element in the first direction D1. In this example, as shown in FIG. 3, original a columns of pixel circuits may be compressed along the first direction D1, so that arrangement space of one column of pixel circuits may be added, and space occupied by a columns of pixel circuits before compression and space occupied by a+1 columns of pixel circuits after compression may be the same. Herein, a may be an integer greater than 1. In this example, a may be equal to 4. However, this embodiment is not limited thereto. For example, a may be equal to 2 or 3.

In other examples, original b rows of pixel circuits may be compressed along a second direction D2, so that arrangement space of one row of pixel circuits is added, and space occupied by b rows of pixel circuits before compression and space occupied by b+1 rows of pixel circuits after compression are the same. Herein, b may be an integer greater than 1. Or, a region in which a newly added pixel circuit is disposed may be obtained by reducing a size of a first pixel circuit in the first direction D1 and the second direction D2.

In the embodiment of the present disclosure, a row of light emitting elements may mean that pixel circuits connected with this row of light emitting elements are all connected with a same gate line (for example, a scan line). A row of pixel circuits may mean that this row of pixel circuits is all connected with a same gate line. However, this embodiment is not limited thereto.

Figure 4:
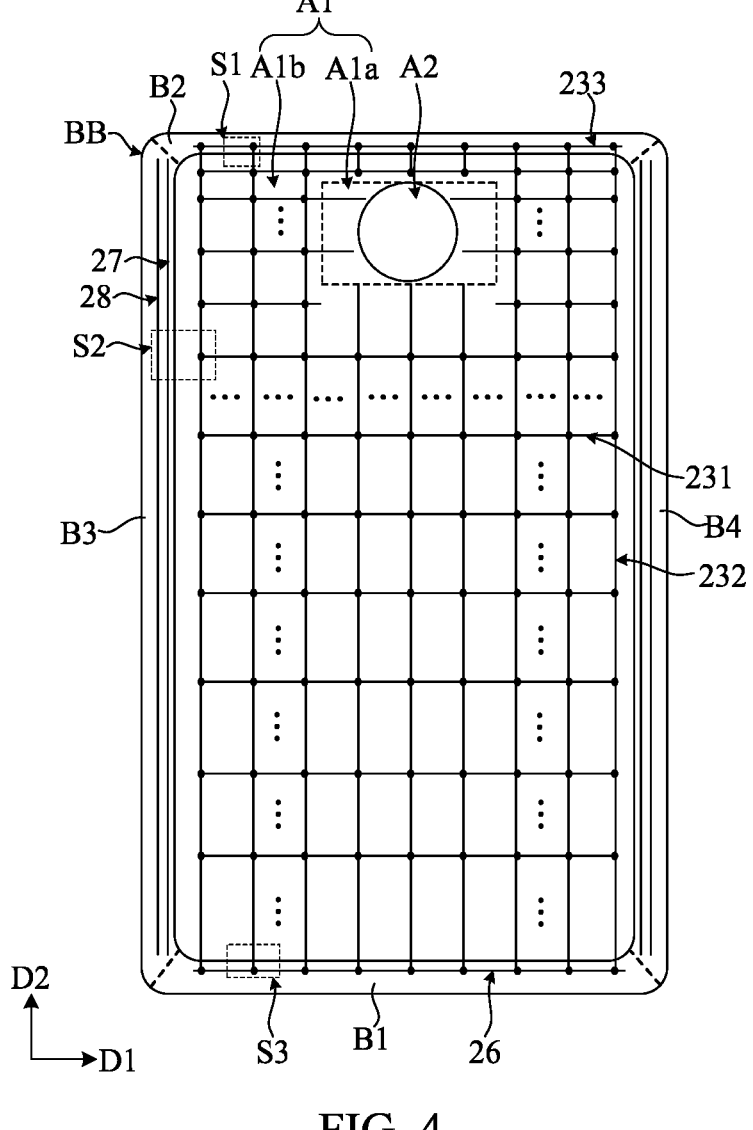
FIG. 4 is a schematic diagram of an arrangement of traces of a display substrate according to at least one embodiment of the present disclosure.

FIG. 4 is a schematic diagram of an arrangement of traces of a display substrate according to at least one embodiment of the present disclosure. In some examples, the first display region A1 may be provided with a plurality of first traces 231 and a plurality of second traces 232. The first traces 231 may extend along the first direction D1 within the first display region A1, and the plurality of first traces 231 may be sequentially arranged along the second direction D2. The plurality of second traces 232 may extend along the second direction D2, and the plurality of second traces 232 may be sequentially arranged along the first direction D1. At least one first trace 231 is electrically connected with at least one second trace 232. For example, two adjacent first traces 231 in the second direction D2 may be electrically connected with at least one identical second trace 232. The plurality of first traces 231 and the plurality of second traces 232 may be electrically connected in the first display region A1 to form a mesh connection structure.

In some examples, as shown in FIG. 4, second traces 232 may not be provided within the transition region A1*a*, so as to avoid an influence of an arrangement of the second traces 232 on an arrangement of data lines electrically connected with second pixel circuits.

In some examples, the second display region A2 will partition at least one data line into a first sub-data line, a second sub-data line, and a third sub-data line, the first sub-data line may be electrically connected with a column of first pixel circuits within the first display region A1 on a lower side of the second display region A2, the second sub-data line may be electrically connected with a column of second pixel circuits within the transition region A1*a* on a left or right side of the second display region A2, and the third sub-data line may be electrically connected with a column of first pixel circuits within the first display region A1 on an upper side of the second display region A2. The first sub-data line and the second sub-data line may be electrically connected through a data connection line, and the second sub-data line and the third sub-data line may be electrically connected through a data connection line. A data connection line may extend along the first direction D1. For example, data connection lines may be arranged within the first display region A1 and located in a region within the first display region A1 close to the second display region A2. The first traces 231 may not extend to a region where a data connection line is located, for example, a first trace 231 may not be disposed in a region where a data connection line is located, so as to avoid an influence of a concentrated arrangement of traces on a light transmittance and a display effect. In other examples, the display substrate may also include a fingerprint recognition region in which a first trace may not be disposed to avoid an influence on a light transmittance. However, this embodiment is not limited thereto.

In some examples, as shown in FIG. 4, the peripheral region BB may include a first bezel region B1, a second bezel region B2, a third bezel region B3, and a fourth bezel region B4. The first bezel region B1 is in communication with the third bezel region B3 and the fourth bezel region B4, and the second bezel region B2 is in communication with the third bezel region B3 and the fourth bezel region B4. The first bezel region B1 and the second bezel region B2 may be located on opposite sides of the display region AA in the second direction D2, and the third bezel region B3 and the fourth bezel region B4 may be located on opposite sides of the display region AA in the first direction D1. For example, the first bezel region B1 may be a lower bezel of the display substrate, the second bezel region B2 may be an upper bezel of the display substrate, the third bezel region B3 may be a left bezel of the display substrate, and the fourth bezel region B4 may be a right bezel of the display substrate. Structures within the third bezel region B3 and the fourth bezel region B4 are substantially the same, and a structure within the third bezel region B3 will be described as an example in following examples.

In some examples, as shown in FIG. 4, the first bezel region B1 may include a first power supply line 26 extending along the first direction D1. In some examples, the first bezel region B1 may include a fan-out region, a bend region, a drive chip region, and a bonding pin region that are sequentially disposed along a direction away from the display region AA. The first power supply line 26 may be disposed in the fan-out region. The fan-out region is connected to the display region and may include a plurality of data lead-out lines configured to connect data lines of the display region in a fan-out trace manner. The bend region may be connected to the fan-out region, may include a composite insulation layer provided with a groove, and is configured to enable the drive chip region and the bonding pin region to be bent to a back surface of the display region AA. An Integrated Circuit (IC) may be disposed in the drive chip region, and the Integrated Circuit may be configured to be connected with the plurality of data fan-out lines. The bonding pin region may include a Bonding Pad, and the Bonding Pad may be configured to be bound and connected with an external Flexible Printed Circuit (FPC). The first power supply line 26 may be electrically connected with the bonding pad of the bonding pin region to receive a first voltage signal. In some examples, the first power supply line 26 may be a double-layer trace, for example, may include a first sub-power supply line and a second sub-power supply line electrically connected with each other, and the first sub-power supply line and the second sub-power supply line may be disposed in different conductive layers. Orthographic projections of the first sub-power supply line and the second sub-power supply line on the base substrate may be overlapped. However, this embodiment is not limited thereto. For example, the first power supply line may be a single-layer trace.

In some examples, as shown in FIG. 4, the second bezel region B2 may include a first power connection line 233 extending along the first direction D1. A second trace 232 extending along the second direction D2 within the first display region A1 may be electrically connected with the first power connection line 233 of the second bezel region B2, and may also be electrically connected with the first power supply line 26 of the first bezel region B1. For example, one end of the second trace 232 may extend to the second bezel region B2 to be electrically connected with the first power connection line 233, and the other end may extend to the first bezel region B1 to be electrically connected with the first power supply line 26. In this example, a static electricity lead-out path from the display region to the peripheral region may be provided through the second trace 232. In addition, the first power supply line 26 and the first power connection line 233 may be communicated through the second trace 232 in the second direction D2, and it is unnecessary to provide a power connection line in the third bezel region B3 and the fourth bezel region B4.

In this example, a third trace may include the first power supply line 26 and the first power connection line 233. However, this embodiment is not limited thereto. In other examples, the third trace may include another long wire located in the peripheral region. Through electrical connections of a first trace, a second trace, and a third trace, a lead-out path is provided for static electricity of the display region.

In some examples, as shown in FIG. 4, the third bezel region B3 may include a circuit region, a power supply line region, a crack dam region, and a cutting region disposed sequentially along a direction away from the display region AA. The circuit region may be connected to the display region AA and may include at least a gate drive circuit, a first initial peripheral trace 27, and a second initial peripheral trace 28. The gate drive circuit may be located on a side of the second initial peripheral trace 28 away from the display region AA, and the first initial peripheral trace 27 may be located on a side of the second initial peripheral trace 28 close to the display region AA. The first initial peripheral trace 27 and the second initial peripheral trace 28 may extend from the third bezel region B3 to the first bezel region B1, for example, may be electrically connected with the bonding pad of the bonding pin region to receive a first initial signal and a second initial signal, respectively. The gate drive circuit may be electrically connected with a scan line and a light emitting control line with which a pixel circuit in the display region is connected. The power supply line region may be connected to the circuit region and may at least include a bezel power supply lead line, the bezel power supply lead line may extend along a direction parallel to an edge of the display region and is electrically connected with a cathode of a light emitting element in the display region AA. The crack dam region may be connected to the power supply line region and may at least include a plurality of cracks disposed on the composite insulation layer. The cutting region may be connected to the crack dam region and may at least include a cutting groove disposed on the composite insulation layer, and the cutting groove is configured for cutting respectively along the cutting groove by a cutting device after all film layers of the display substrate are prepared.

In some examples, the first initial peripheral trace 27 and the second initial peripheral trace 28 may both be double-layer traces, the first initial peripheral trace 27 may include a first initial sub-trace 271 and a third initial sub-trace 272 stacked and electrically connected with each other, and the second initial peripheral trace 28 may include a second initial sub-trace 281 and a fourth initial sub-trace 282 stacked and electrically connected with each other. However, this embodiment is not limited thereto. For example, the first initial peripheral trace 27 and the second initial peripheral trace 28 may be single-layer traces.

Figure 7:
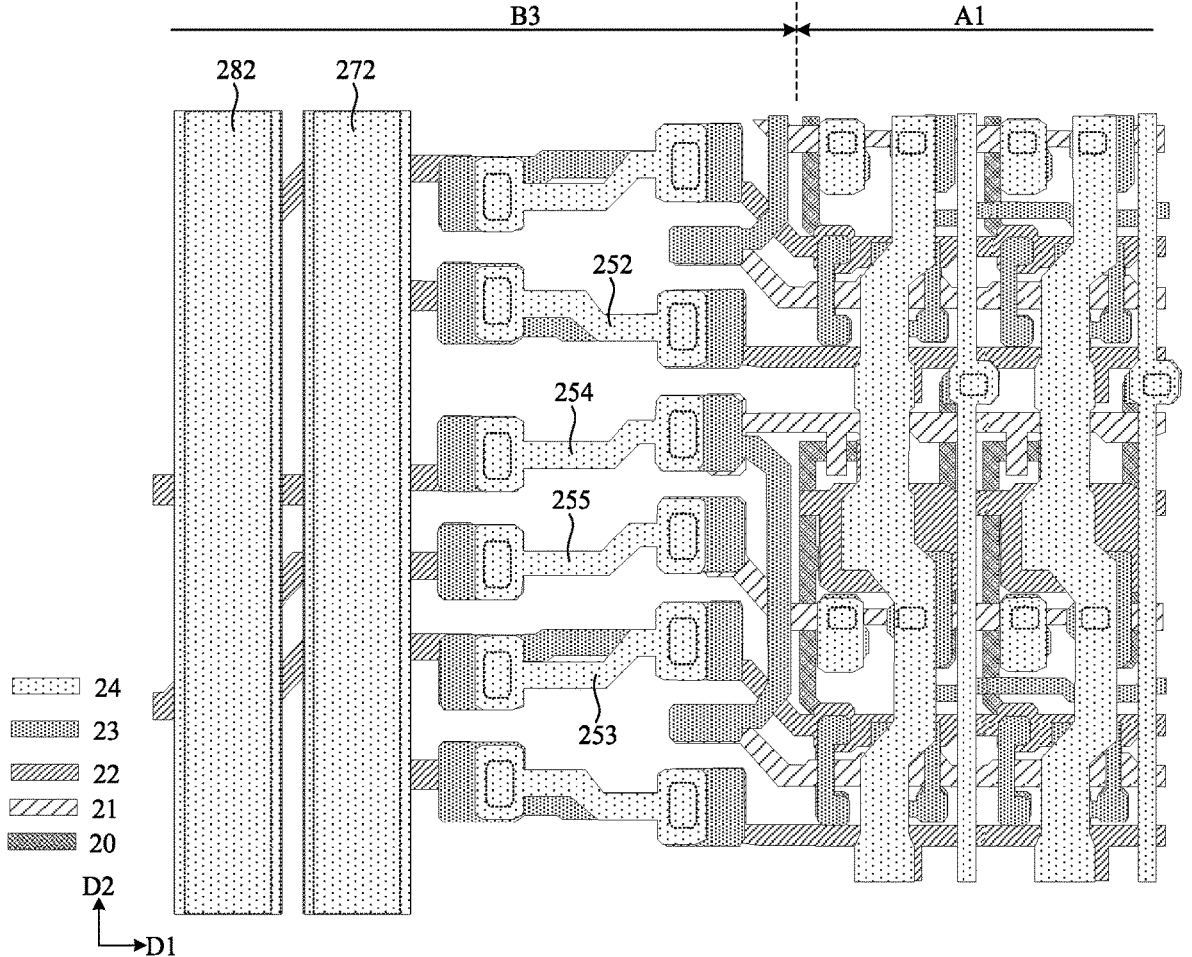
FIG. 7 is a partial enlarged schematic diagram of a circuit structure layer of a region S2 in FIG. 4.

FIG. 5 is a partial enlarged schematic diagram of a circuit structure layer of a region S1 in FIG. 4. FIG. 6 is a partial cross-sectional schematic diagram along a Q-Q' direction in FIG. 5. FIG. 7 is a partial enlarged schematic diagram of a circuit structure layer of a region S2 in FIG. 4. FIG. 8 is a partial enlarged schematic diagram of a circuit structure layer of a region S3 in FIG. 4.

In some examples, the first display region A1 may include a first circuit region A11 and a second circuit region A12 arranged at intervals in the first direction D1. The first circuit region A11 may be provided with a plurality of columns of first pixel circuits 11 (for example, four columns of first pixel circuits), and the second circuit region A12 may be provided with one column of invalid pixel circuits 15 (for example, including a plurality of invalid pixel circuits) or may be provided with one column of pixel circuits including an invalid pixel circuit and a second pixel circuit. FIG. 5, FIG. 7, and FIG. 8 are illustrated by taking an invalid pixel circuit included by the second circuit region A12 as an example. When the second circuit region A12 includes the second pixel circuit, a second trace may not be disposed, or a first trace and a second trace may not be disposed. A structure of a film layer and a preparation process of the gate drive circuit of the peripheral region are omitted in following examples.

In some examples, as shown in FIGS. 5 and 6, in a direction perpendicular to the display substrate, the display substrate of the first display region A1 may include a base substrate 100, and a semiconductor layer 20, a first conductive layer 21, a second conductive layer 22, a third conductive layer 23, and a fourth conductive layer 24 that are sequentially disposed on the base substrate 100. A first insulation layer 101 may be disposed between the semiconductor layer 20 and the first conductive layer 21, a second insulation layer 102 may be disposed between the first conductive layer 21 and the second conductive layer 22, a third insulation layer 103 may be disposed between the second conductive layer 22 and the third conductive layer 23, and a fourth insulation layer 104 and a fifth insulation layer 105 may be disposed between the third conductive layer 23 and the fourth conductive layer 24. In some examples, the first insulation layer 101 to the fourth insulation layer 104 may all be inorganic insulation layers, and the fifth insulation layer 105 may be an organic insulation layer. The first conductive layer 21 may also be referred to as a first gate metal layer, the second conductive layer 22 may also be referred to as a second gate metal layer, the third conductive layer 23 may also be referred to as a first source-drain metal layer, and the fourth conductive layer 24 may also be referred to as a second source-drain metal layer. However, this embodiment is not limited thereto.

Figures 9A, 9B:
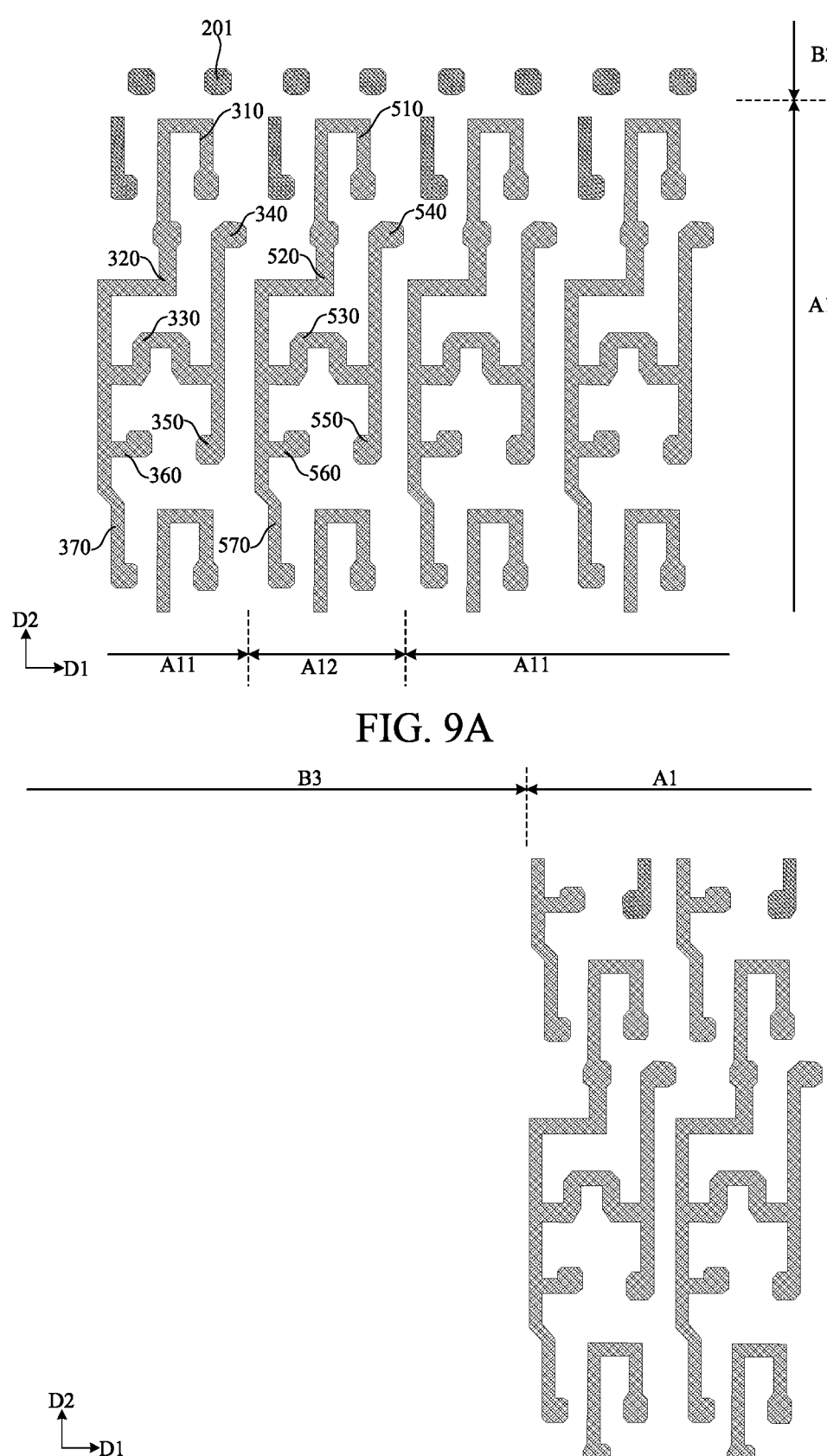
FIG. 9A is a schematic diagram of the circuit structure layer after a semiconductor layer is formed in FIG. 5.
FIG. 9B is a schematic diagram of the circuit structure layer after a semiconductor layer is formed in FIG. 7.
Figure 9C:
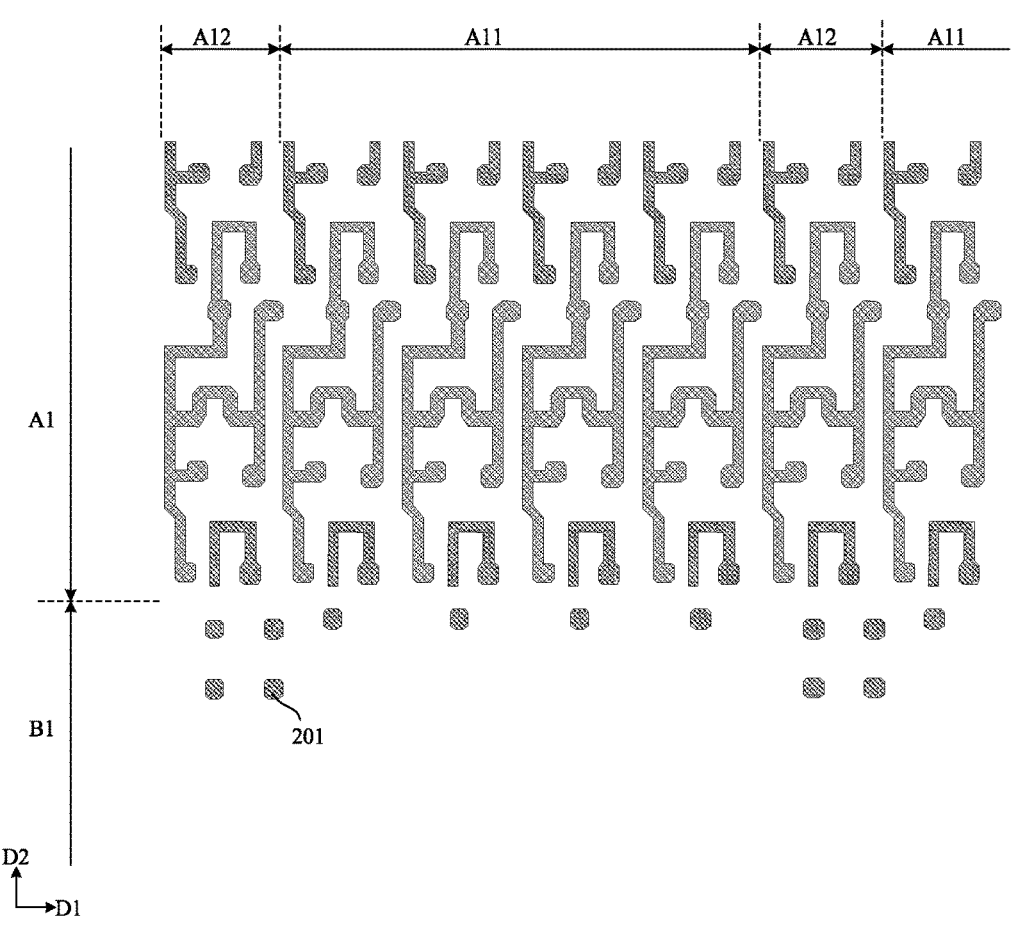
FIG. 9C is a schematic diagram of the circuit structure layer after a semiconductor layer is formed in FIG. 8.

FIG. 9A is a schematic diagram of the circuit structure layer after a semiconductor layer is formed in FIG. 5. FIG. 9B is a schematic diagram of the circuit structure layer after a semiconductor layer is formed in FIG. 7. FIG. 9C is a schematic diagram of the circuit structure layer after a semiconductor layer is formed in FIG. 8.

In some examples, as shown in FIGS. 9A to 9C, the semiconductor layer 20 of the first display region A1 may include at least: active layers of a plurality of transistors of a plurality of pixel circuits (e.g., including: an active layer 510 of a first reset transistor, an active layer 520 of a threshold compensation transistor, an active layer 530 of a drive transistor, an active layer 540 of a data writing transistor, an active layer 550 of a first light emitting control transistor, an active layer 560 of a second light emitting control transistor, and an active layer 570 of a second reset transistor of an invalid pixel circuit; an active layer 310 of a first reset transistor, an active layer 320 of a threshold compensation transistor, an active layer 330 of a drive transistor, an active layer 340 of a data writing transistor, an active layer 350 of a first light emitting control transistor, an active layer 360 of a second light emitting control transistor, and an active layer 370 of a second reset transistor of a first pixel circuit). In this example, active layers of seven transistors of a pixel circuit may be of an integral structure. An active layer of each transistor may include a first region, a second region, and a channel region located between the first region and the second region. In some examples, the first region and the second region of the active layer may be interpreted as a source electrode or a drain electrode of a transistor. A part of the active layer between transistors may be interpreted as a wiring doped with an impurity, and may be used for electrically connecting the transistors.

In some examples, as shown in FIG. 9A, the semiconductor layer 20 of the second bezel region B2 may include a plurality of invalid semiconductor blocks 201. The plurality of invalid semiconductor blocks 201 of the second bezel region B2 may be close to an edge of the first display region A1 and may be sequentially arranged along the first direction D1. As shown in FIG. 9C, the semiconductor layer 20 of the first bezel region B1 may include a plurality of invalid semiconductor blocks 201. The plurality of invalid semiconductor blocks 201 of the first bezel region B1 may be close to the edge of the first display region A1 and may be regularly arranged along the first direction D1 and the second direction D2. In some examples, a plurality of invalid semiconductor blocks may be disposed within the third bezel region B3 and the fourth bezel region B4, and the invalid semiconductor blocks may be close to the edge of the first display region A1. In this example, by disposing a plurality of invalid semiconductor blocks in the peripheral region, it is beneficial to improve uniformity of a film layer in a preparation process.

In some examples, a material of the semiconductor layer 20, for example, may include poly silicon. The channel region may not be doped with an impurity, and has characteristics of a semiconductor. The first region and the second region located on two sides of the channel region may be doped with impurities and thus have electrical conductivity. The impurities may be changed according to a type of a transistor. However, this embodiment is not limited thereto.

Figure 10A:
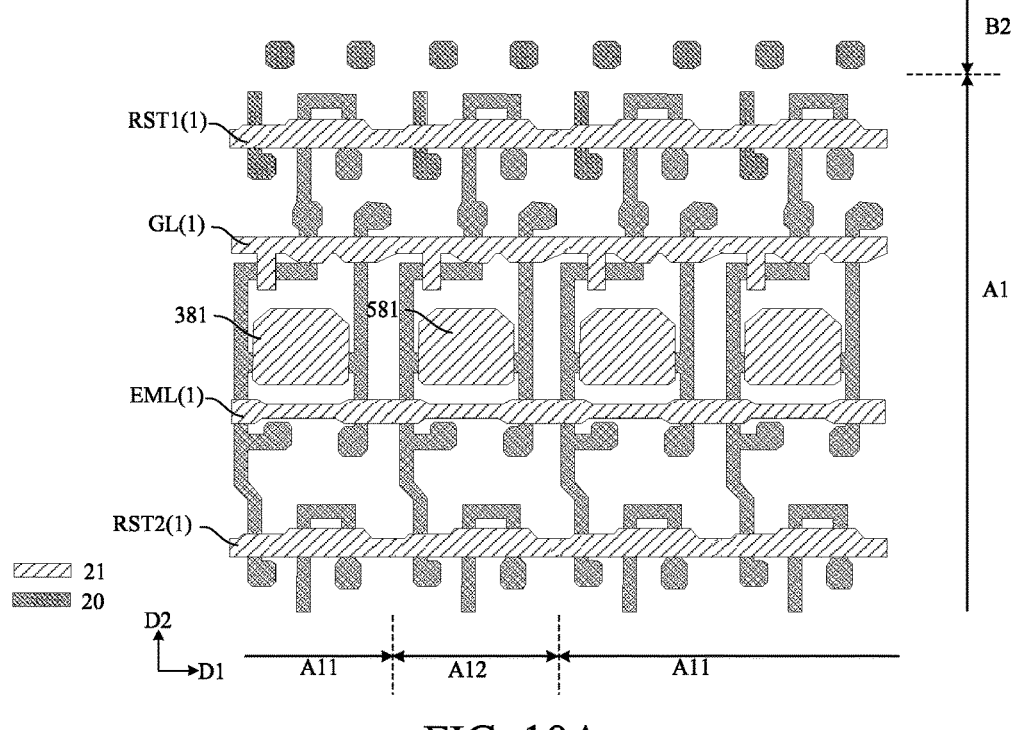
FIG. 10A is a schematic diagram of the circuit structure layer after a first conductive layer is formed in FIG. 5.
Figures 10B, 10C:
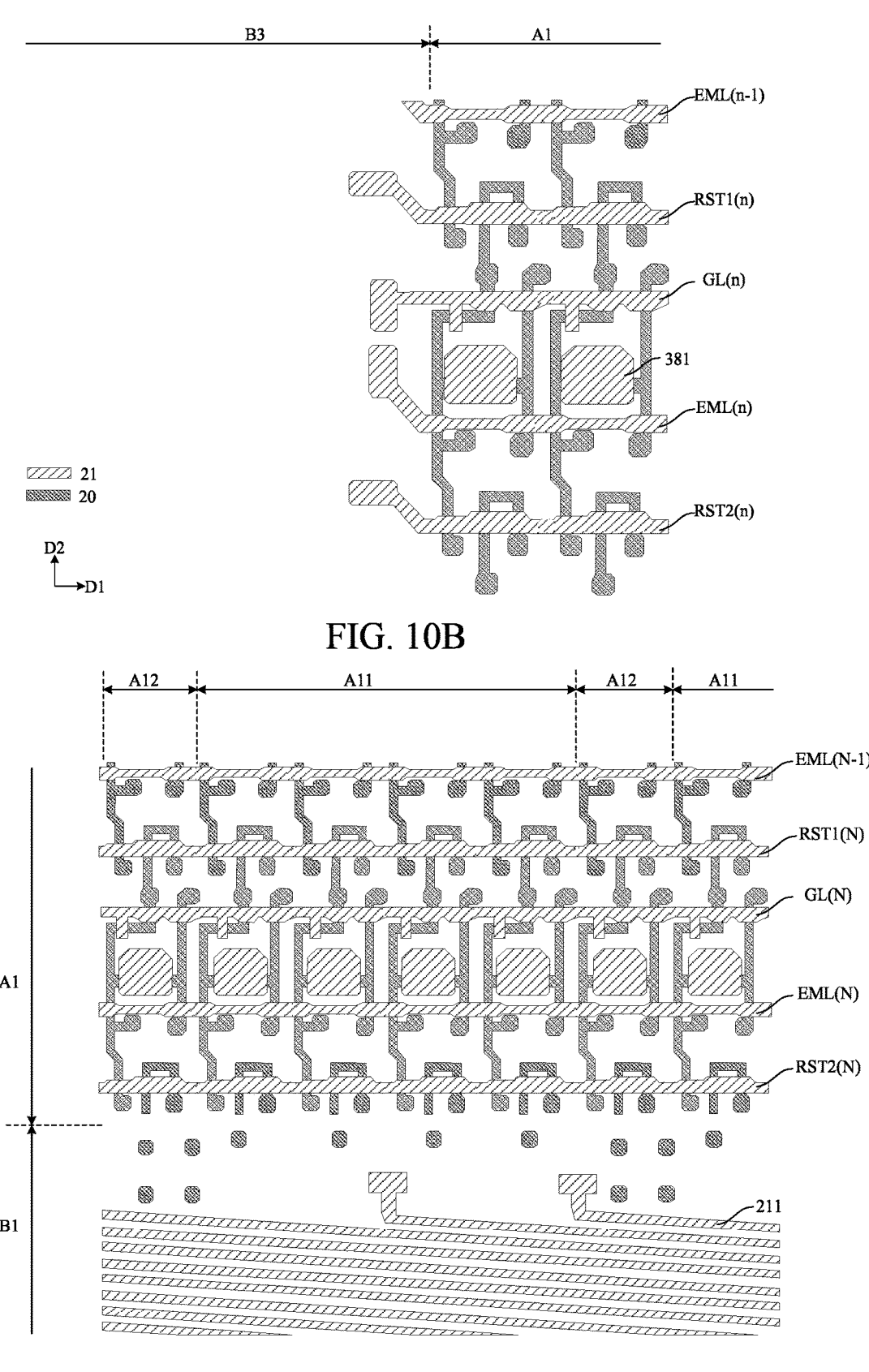
FIG. 10B is a schematic diagram of the circuit structure layer after a first conductive layer is formed in FIG. 7.
FIG. 10C is a schematic diagram of the circuit structure layer after a first conductive layer is formed in FIG. 8.

FIG. 10A is a schematic diagram of the circuit structure layer after a first conductive layer is formed in FIG. 5. FIG. 10B is a schematic diagram of the circuit structure layer after a first conductive layer is formed in FIG. 7. FIG. 10C is a schematic diagram of the circuit structure layer after a first conductive layer is formed in FIG. 8.

In some examples, as shown in FIGS. 10A to 10C, the first conductive layer 21 of the first display region A1 may include at least: gates of a plurality of transistors and first capacitor plates of storage capacitors of a plurality of pixel circuits (e.g., a first capacitor plate 581 of a storage capacitor of an invalid pixel circuit, a first capacitor plate 381 of a storage capacitor of a first pixel circuit), a scan line (e.g., scan lines GL(1), GL(n), GL(N)), a light emitting control line (e.g., light emitting control lines EML(1), EML(n−1), EML(n), EML(N−1), and EML(N)), a first reset control line (e.g., first reset control lines RST1(1), RST1(n), and RST1 (N)), and a second reset control line (e.g., second reset control lines RST2(1), RST2(n), and RST2(N)). Herein, N is greater than or equal to n, and both N and n are integers. The scan line, the light emitting control line, the first reset control line, and the second reset control line may all be in a line shape of which a main body portion extends along the first direction D1. A scan line with which a row of pixel circuits are electrically connected may be located between a first reset control line and a light emitting control line with which the row of pixel circuits are electrically connected. In this example, a second reset control line with which one row of pixel circuits are electrically connected is a first reset control line with which a next row of pixel circuits are electrically connected.

In some examples, as shown in FIG. 10A, taking a first row of pixel circuits as an example, an overlapping region of the first reset control line RST1(1) and an active layer 310 of a first reset transistor of a first pixel circuit of a present row may serve as a gate of the first reset transistor of the first pixel circuit, an overlapping region of the first reset control line RST1(1) and an active layer 510 of a first reset transistor of an invalid pixel circuit of this row may serve as a gate of the first reset transistor of the invalid pixel circuit. An overlapping region of the scan line GL(1) and an active layer 320 of a threshold compensation transistor of the first pixel circuit of this row may serve as a gate of the threshold compensation transistor of the first pixel circuit, an overlapping region of the scan line GL(1) and an active layer 340 of a data writing transistor of the first pixel circuit of this row may serve as a gate of the data writing transistor of the first pixel circuit, an overlapping region of the scan line GL(1) and an active layer 520 of a threshold compensation transistor of the invalid pixel circuit of this row may serve as a gate of the threshold compensation transistor of the invalid pixel circuit, and an overlapping region of the scan line GL(1) and an active layer 540 of a data writing transistor of the invalid pixel circuit of this row may serve as a gate of the data writing transistor of the invalid pixel circuit. An overlapping region of the light emitting control line EML(1) and an active layer 350 of a first light emitting control transistor of the first pixel circuit of this row may serve as a gate of the first light emitting control transistor of the first pixel circuit, an overlapping region of the light emitting control line EML(1) and an active layer 360 of a second light emitting control transistor of the first pixel circuit of this row may serve as a gate of the second light emitting control transistor of the first pixel circuit, an overlapping region of the light emitting control line EML(1) and an active layer 550 of a first light emitting control transistor of the invalid pixel circuit of this row may serve as a gate of the first light emitting control transistor of the invalid pixel circuit, an overlapping region of the light emitting control line EML(1) and an active layer 560 of a second light emitting control transistor of the invalid pixel circuit of this row may serve as a gate of the second light emitting control transistor of the invalid pixel circuit. An overlapping region of the second reset control line RST2(1) and an active layer 370 of a second reset transistor of the first pixel circuit of this row may serve as a gate of the second reset transistor of the first pixel circuit, an overlapping region of the second reset control line RST2(1) and an active layer 570 of a second reset transistor of the invalid pixel circuit of this row may serve as a gate of the second reset transistor of the invalid pixel circuit, an overlapping region of the second reset control line RST2(1) and an active layer of a first reset transistor of a first pixel circuit of a next row may serve as a gate of the first reset transistor of the first pixel circuit of the next row, an overlapping region of the second reset control line RST2(1) and an active layer of a first reset transistor of an invalid pixel circuit of the next row may serve as a gate of the first reset transistor of the invalid pixel circuit of the next row.

In some examples, as shown in FIG. 10A, a shape of the first capacitor plate 381 of the storage capacitor of the first pixel circuit may be a rectangle and corners of the rectangle may be chamfered. An orthographic projection of the first capacitor plate 381 on the base substrate is overlapped with an orthographic projection of the active layer 330 of the drive transistor of the first pixel circuit on the base substrate. The first capacitor plate 381 of the first pixel circuit may serve as an electrode plate of the storage capacitor and a gate of the drive transistor at the same time. A shape of the first capacitor plate 581 of the storage capacitor of the invalid pixel circuit may be a rectangle and corners of the rectangle may be chamfered. An orthographic projection of the first capacitor plate 581 on the base substrate is overlapped with an orthographic projection of the active layer 530 of the drive transistor of the invalid pixel circuit on the base substrate. The first capacitor plate 581 of the invalid pixel circuit may serve as an electrode plate of the storage capacitor and a gate of the drive transistor at the same time.

In some examples, as shown in FIG. 10B, one end of the first reset control line RST1($n$) may extend to the third bezel region B3. One end of the second reset control line RST2($n$) may extend to the third bezel region B3. One end of the light emitting control line EML(n) may extend to the third bezel region B3. One end of the scan line GL(n) may extend to the third bezel region B3.

In some examples, as shown in FIG. 10C, the first conductive layer 21 of the first bezel region B1 may include a plurality of first data fan-out lines 211. A first data fan-out line 211 may be configured to be electrically connected with a data line of the first display region A1 in a fan-out trace manner, and may also be electrically connected with an integrated circuit disposed in the drive chip region of the first bezel region B1. The first data fan-out line 211 may be configured to transmit a data signal to the data line of the first display region A1.

Figures 11A, 11B:
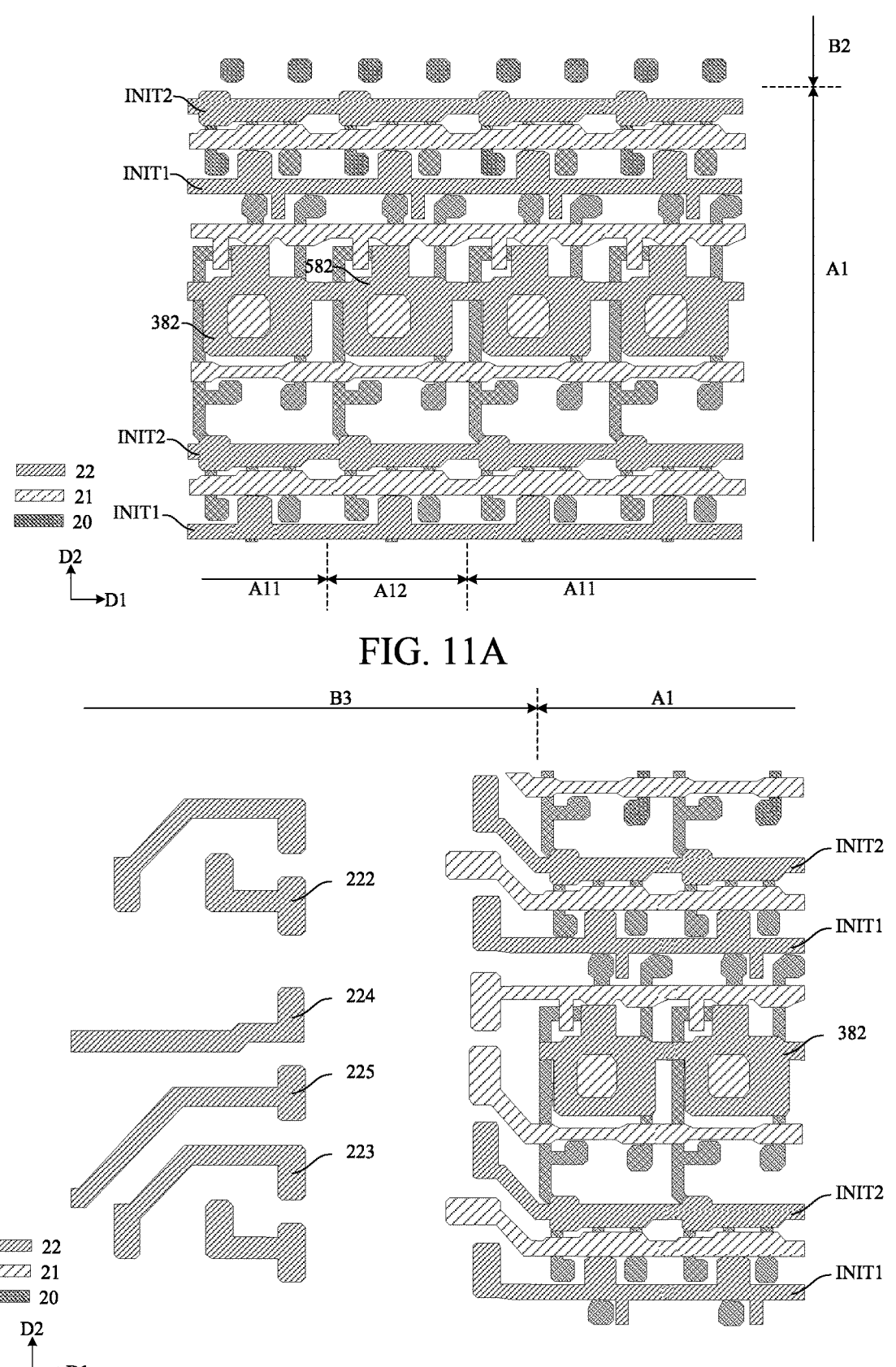
FIG. 11A is a schematic diagram of the circuit structure layer after a second conductive layer is formed in FIG. 5.
FIG. 11B is a schematic diagram of the circuit structure layer after a second conductive layer is formed in FIG. 7.
Figure 11C:
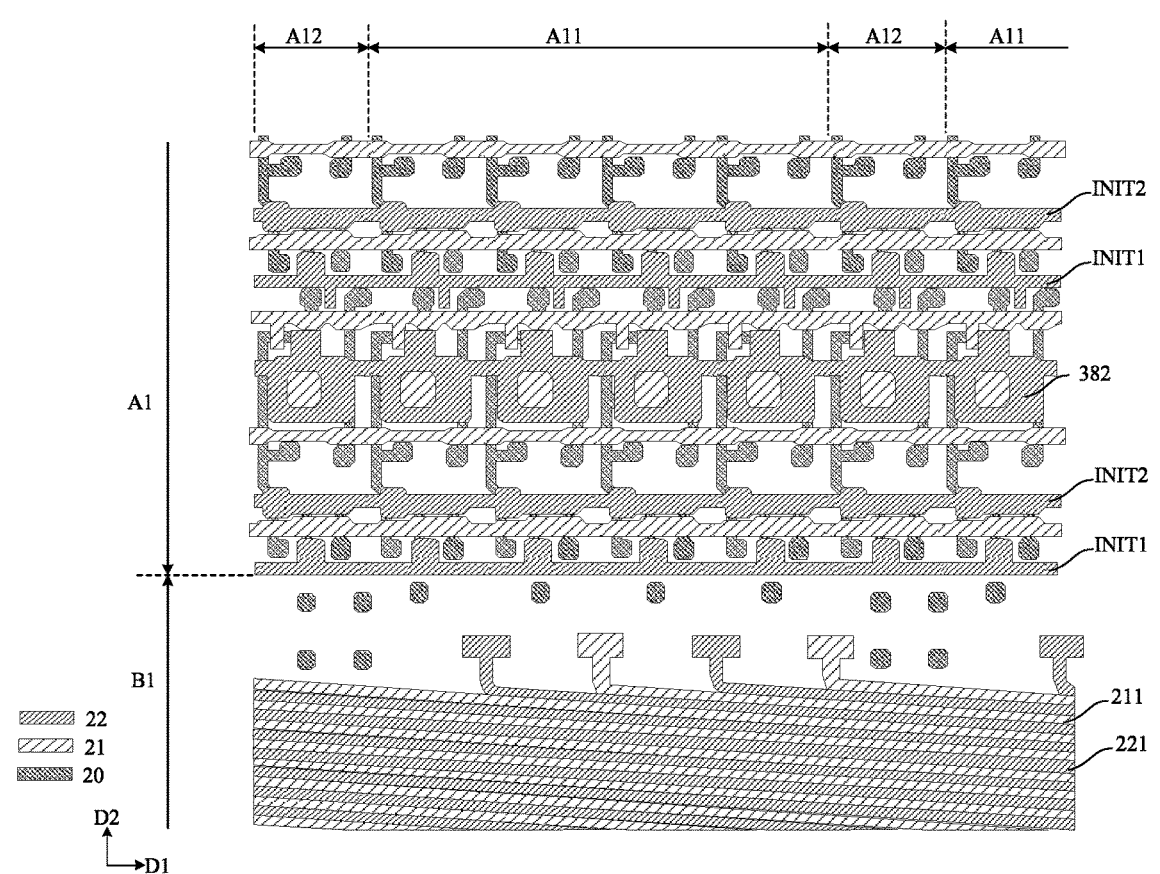
FIG. 11C is a schematic diagram of the circuit structure layer after a second conductive layer is formed in FIG. 8.

FIG. 11A is a schematic diagram of the circuit structure layer after a second conductive layer is formed in FIG. 5. FIG. 11B is a schematic diagram of the circuit structure layer after a second conductive layer is formed in FIG. 7. FIG. 11C is a schematic diagram of the circuit structure layer after a second conductive layer is formed in FIG. 8.

In some examples, as shown in FIGS. 11A to 11C, the second conductive layer 22 of the first display region A1 may include second capacitor plates of storage capacitors of a plurality of pixel circuits (e.g., a second capacitor plate 382 of a first pixel circuit, a second capacitor plate 582 of an invalid pixel circuit), a plurality of first initial signal lines INIT1, and a plurality of second initial signal lines INIT2. A first initial signal line INIT1 and a second initial signal line INIT2 may be in a line shape of which a main body portion extends along the first direction D1. An orthographic projection of the second capacitor plate 382 of the first pixel circuit on the base substrate is overlapped with an orthographic projection of the first capacitor plate 381 on the base substrate. An orthographic projection of the second capacitor plate 582 of the invalid pixel circuit on the base substrate is overlapped with an orthographic projection of the first capacitor plate 581 on the base substrate. In some examples, in one row of pixel circuits, second capacitor plates of storage capacitors of adjacent pixel circuits may be electrically connected with each other, for example, the second capacitor plate 382 of the storage capacitor of the first pixel circuit and the second capacitor plate 582 of the storage capacitor of the invalid pixel circuit may form an interconnected integral structure. A second capacitor plate of the integral structure may be multiplexed as a power supply signal connection line, so as to ensure that a plurality of second capacitor plates in a row of pixel circuits have a same potential, which is beneficial to improving uniformity of the display substrate, avoiding poor display of the display substrate, and ensuring a display effect of the display substrate.

In some examples, as shown in FIG. 11A, the second capacitor plate 382 of the first pixel circuit may have an opening exposing the first capacitor plate 381. The second capacitor plate 582 of the invalid pixel circuit may have an opening exposing the first capacitor plate 581.

In some examples, as shown in FIG. 11C, the second conductive layer 22 of the first bezel region B1 may include a plurality of second data fan-out lines 221. A second data fan-out line 221 may be configured to be electrically connected with a data line of the first display region A1 in a fan-out trace manner, and may also be electrically connected with an integrated circuit disposed in the drive chip region of the first bezel region B1. The second data fan-out line 221 may be configured to transmit a data signal to the data line of the first display region A1. In this example, the first data fan-out lines 211 and the second data fan-out lines 221 may be arranged at intervals.

In some examples, as shown in FIG. 11B, one end of the first initial signal line INIT1 and one end of the second initial signal line INIT2 may both extend to the third bezel region B3.

In some examples, as shown in FIG. 11B, the second conductive layer 22 of the third bezel region B3 may include a third initial transfer line 222, a fourth initial transfer line 223, a scan output line 224, and a light emitting control output line 225. The third initial transfer line 222 is configured to subsequently connect the first initial signal line INIT1 and the first initial peripheral trace. The fourth initial transfer line 223 is configured to subsequently connect the second initial signal line INIT2 and the second initial peripheral trace. The scan output line 224 is configured to connect the scan line GL(n) with a scan signal output terminal of the gate drive circuit. The light emitting control output line 225 is configured to connect the light emitting control line EML(n) with a light emitting control signal output terminal of the gate drive circuit. In other examples, the third initial transfer line 222 and the fourth initial transfer line 223 may be located in the first conductive layer. However, this embodiment is not limited thereto.

Figure 12A:
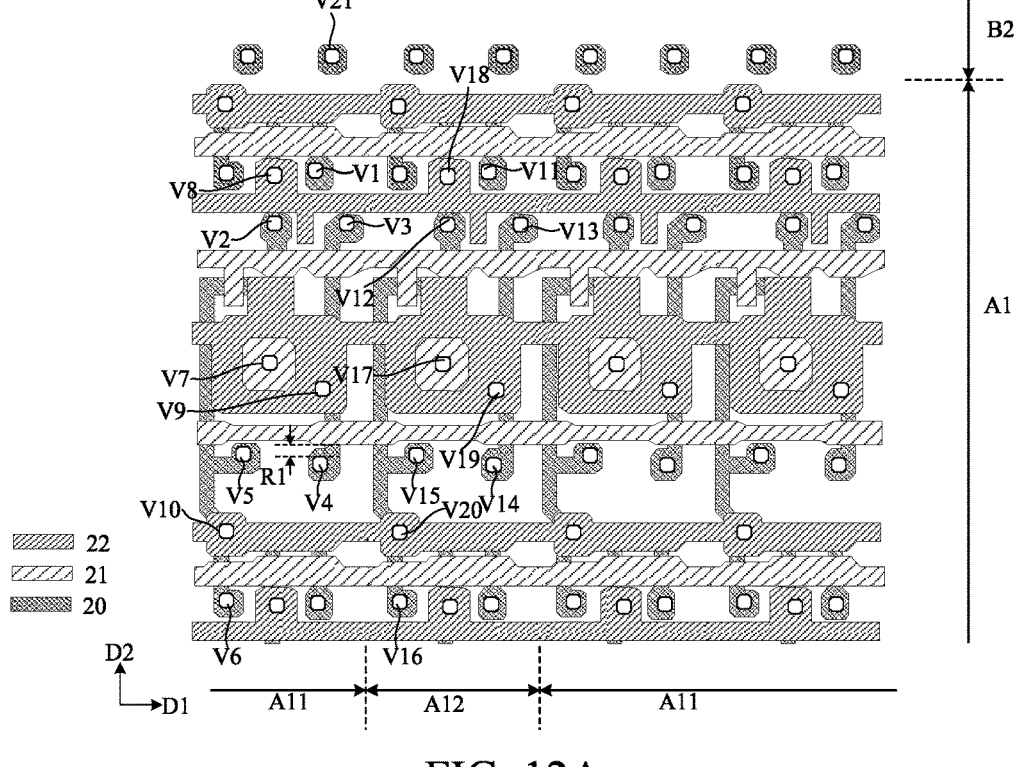
FIG. 12A is a schematic diagram of the circuit structure layer after a third insulation layer is formed in FIG. 5.
Figure 12B:
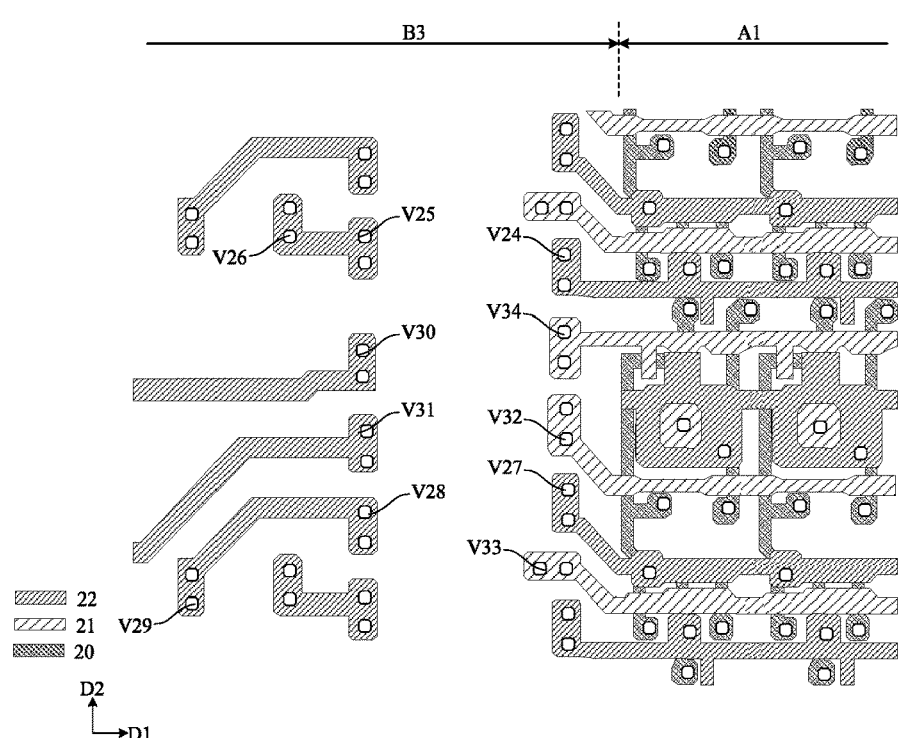
FIG. 12B is a schematic diagram of the circuit structure layer after a third insulation layer is formed in FIG. 7.
Figure 12C:
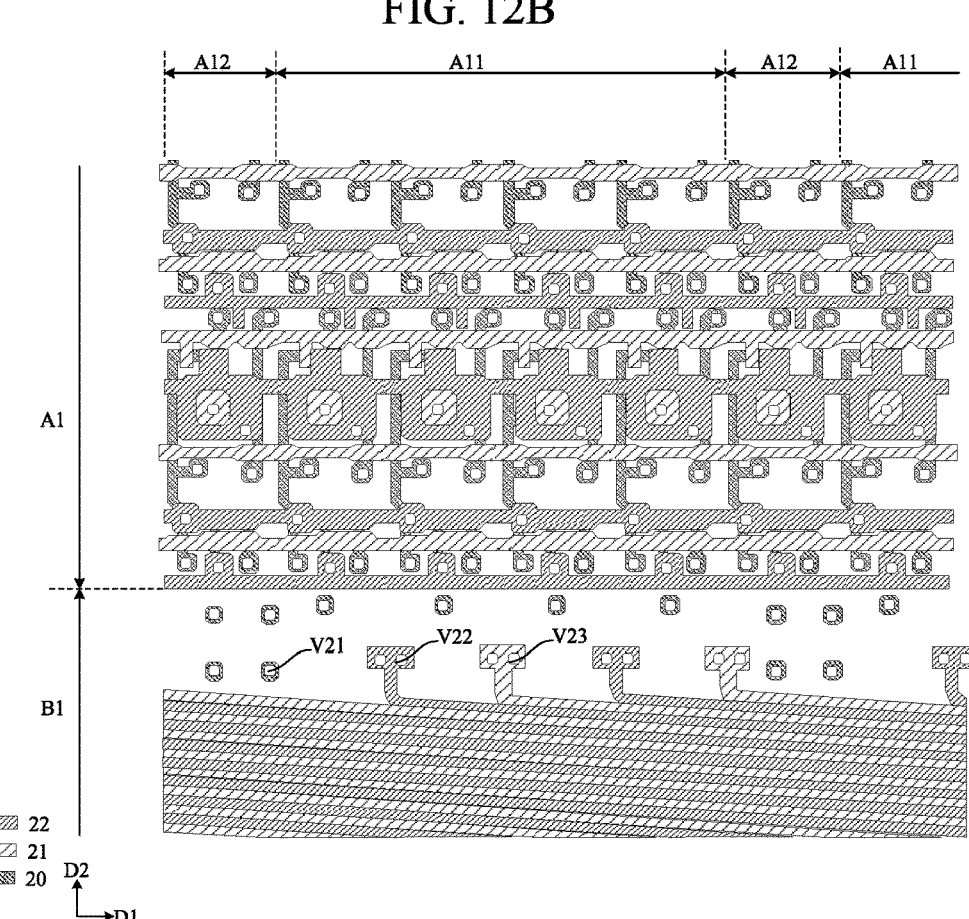
FIG. 12C is a schematic diagram of the circuit structure layer after a third insulation layer is formed in FIG. 8.

FIG. 12A is a schematic diagram of the circuit structure layer after a third insulation layer is formed in FIG. 5. FIG. 12B is a schematic diagram of the circuit structure layer after a third insulation layer is formed in FIG. 7. FIG. 12C is a schematic diagram of the circuit structure layer after a third insulation layer is formed in FIG. 8.

In some examples, as shown in FIGS. 12A to 12C, the third insulation layer 103 of the first display region A1 may be provided with a plurality of vias, which may include, for example, a first via V1 to a twentieth via V20. The third insulation layer 103, the second insulation layer 102, and the first insulation layer 101 within the first via V1 to the sixth via V6 and the eleventh via V11 to the sixteenth via V16 are removed to expose a surface of the semiconductor layer 20. The third insulation layer 103 and the second insulation layer 102 within the seventh via V7 and the seventeenth via V17 are removed to expose a surface of the first conductive layer 21. The third insulation layer 103 within the eighth via V8 to the tenth via V10 and the eighteenth via V18 to the twentieth via V20 is removed to expose a surface of the second conductive layer 22.

In some examples, as shown in FIG. 12A, a distance, in the second direction D2, between an orthographic projection of at least one of the plurality of vias provided in the third insulation layer 103 on the base substrate and an orthographic projection of at least one trace of the first conductive layer or the second conductive layer on the base substrate may be greater than or equal to 2 microns. For example, a distance R1 between an upper edge of the fourth via V4 in the second direction D2 and a lower edge of the light emitting control line EML(1) in the second direction D2 may be greater than or equal to 2 microns. In this example, an ESD risk is improved by increasing a distance between a via and a trace of the first conductive layer or the second conductive layer.

In some examples, as shown in FIG. 12A, the third insulation layer 103 of the second bezel region B2 may be provided with a plurality of vias which may include, for example, a plurality of twenty-first vias V21. The third insulation layer 103, the second insulation layer 102, and the first insulation layer 101 within the twenty-first vias V21 are removed to expose a surface of the semiconductor layer 20. One twenty-first via V21 may expose a surface of one invalid semiconductor block 201. By disposing a via which exposes an invalid semiconductor block, a gas generated in a preparation process may be released, and a situation such as bulge or damage of a film layer may be avoided.

In some examples, as shown in FIG. 12C, the third insulation layer 103 of the first bezel region B1 may be provided with a plurality of vias, for example, may include a plurality of twenty-first vias V21, twenty-second vias V22, and twenty-third vias V23. The third insulation layer 103, the second insulation layer 102, and the first insulation layer 101 within a twenty-first via V21 are removed to expose a surface of the semiconductor layer 20. The third insulation layer 103 within a twenty-second via V22 is removed to expose a surface of a second data fan-out line 221 of the second conductive layer 22. The third insulation layer 103 and the second insulation layer 102 within a twenty-third via V23 are removed to expose a surface of a first data fan-out line 211 of the first conductive layer 21.

In some examples, as shown in FIG. 12B, the third insulation layer 103 of the third bezel region B3 may be provided with a plurality of vias, for example, which may include a twenty-fourth via V24 to a thirty-fourth via V34. The third insulation layer 103 within the twenty-fourth via V24 to the thirty-first via V31 is removed to expose a surface of the second conductive layer 22. The third insulation layer 103 and the second insulation layer 102 within the thirty-second via V32 and the thirty-third via V33 are removed to expose a surface of the first conductive layer 21.

Figures 13A, 13B:
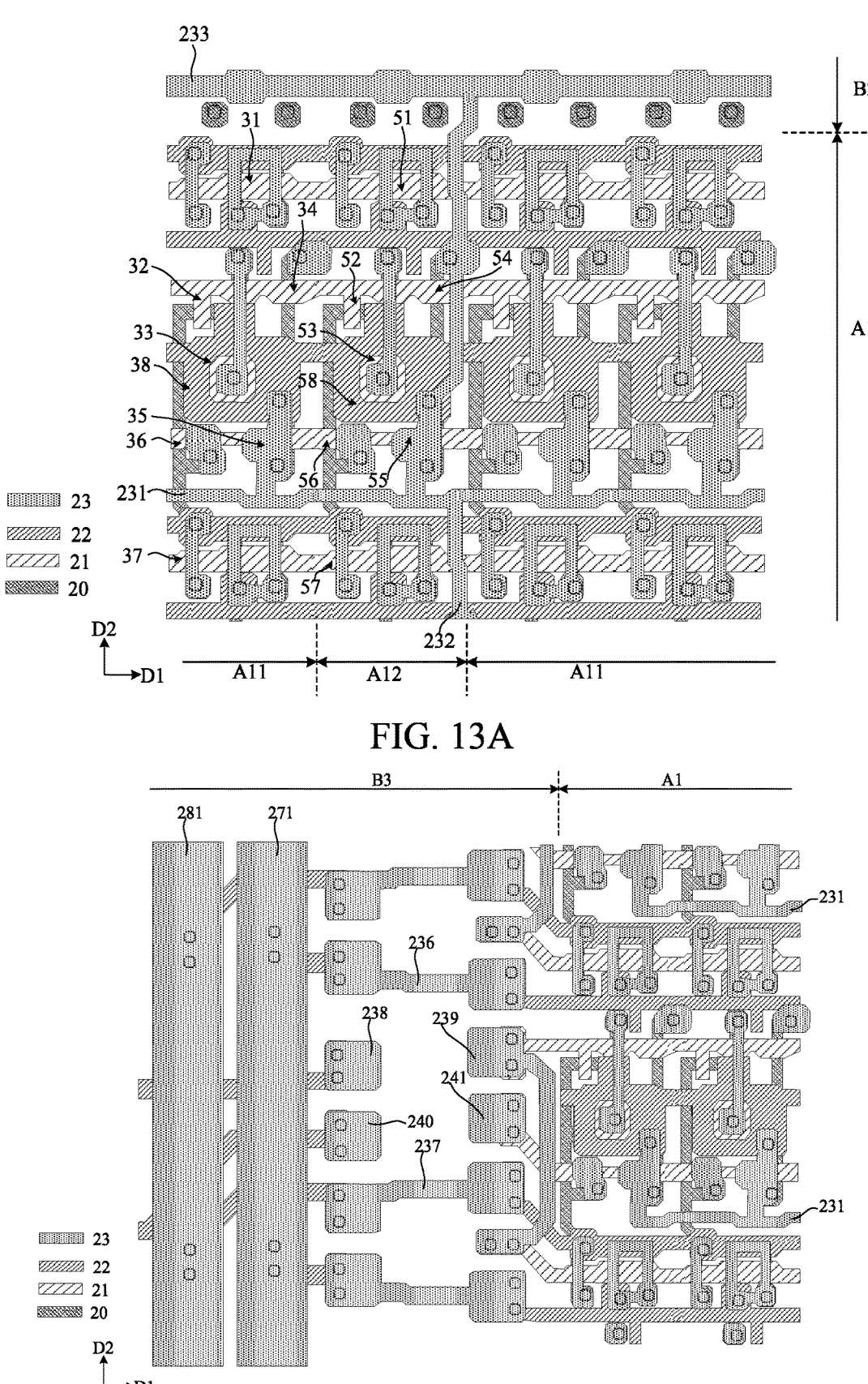
FIG. 13A is a schematic diagram of the circuit structure layer after a third conductive layer is formed in FIG. 5.
FIG. 13B is a schematic diagram of the circuit structure layer after a third conductive layer is formed in FIG. 7.
Figure 13C:
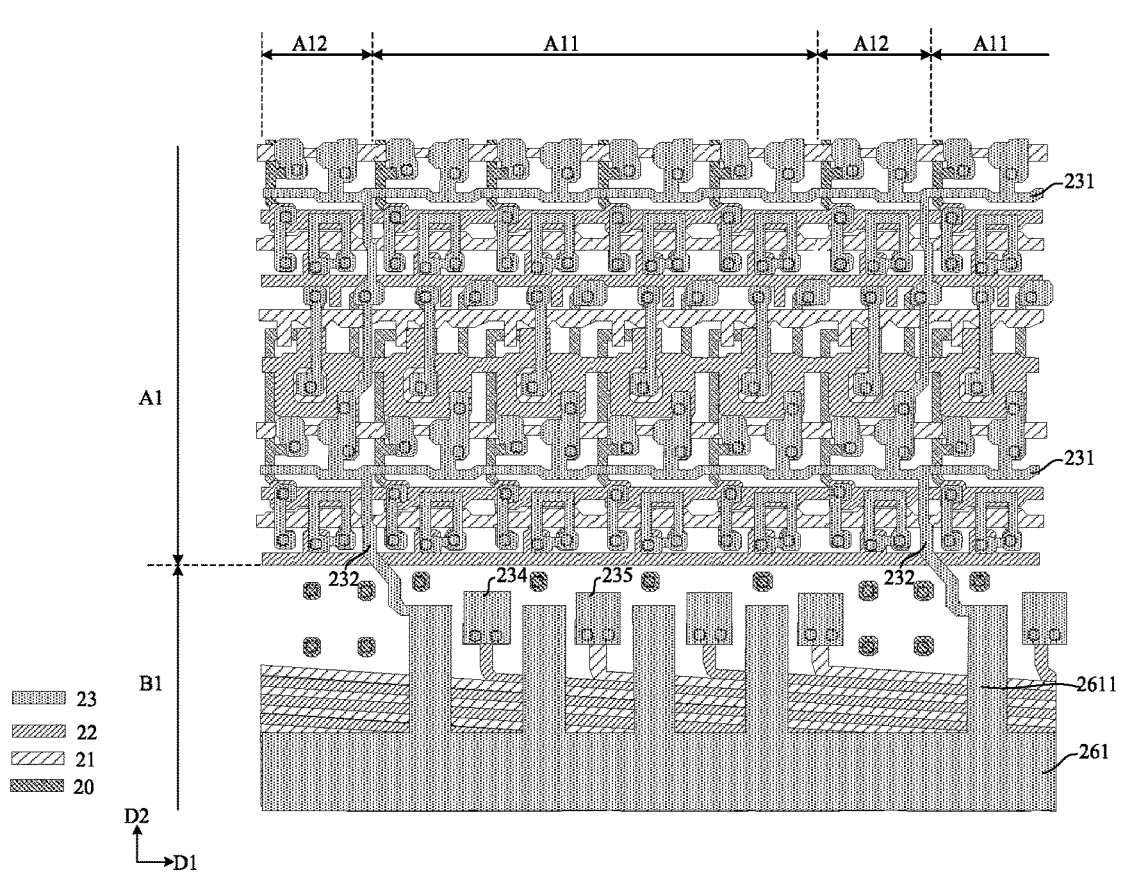
FIG. 13C is a schematic diagram of the circuit structure layer after a third conductive layer is formed in FIG. 8.
Figure 14A:
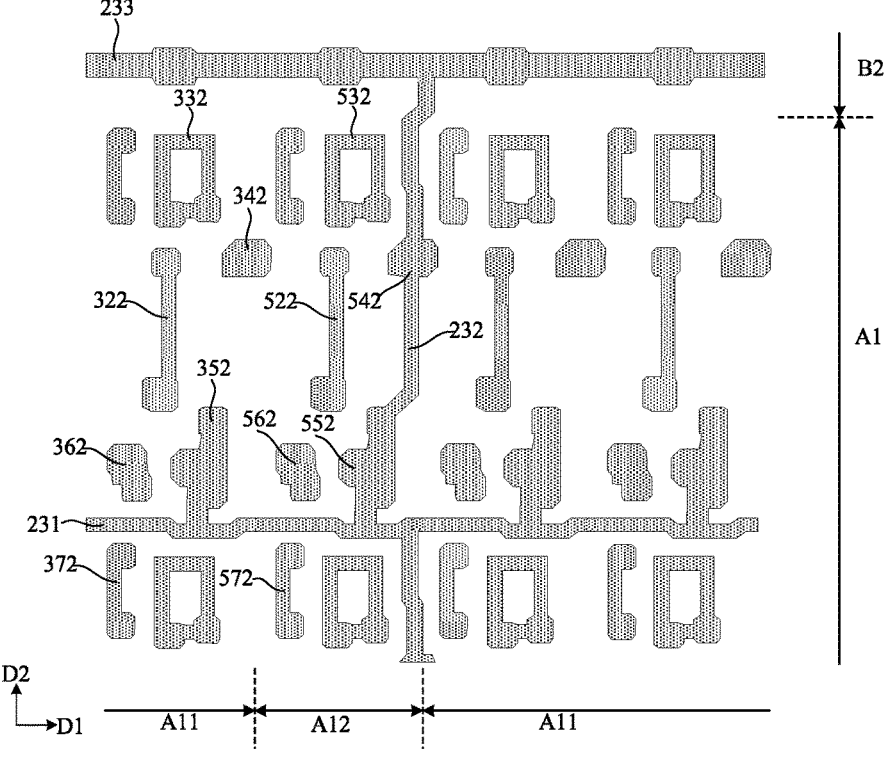
FIG. 14A is a schematic diagram of the third conductive layer in FIG. 5.
Figure 14B:
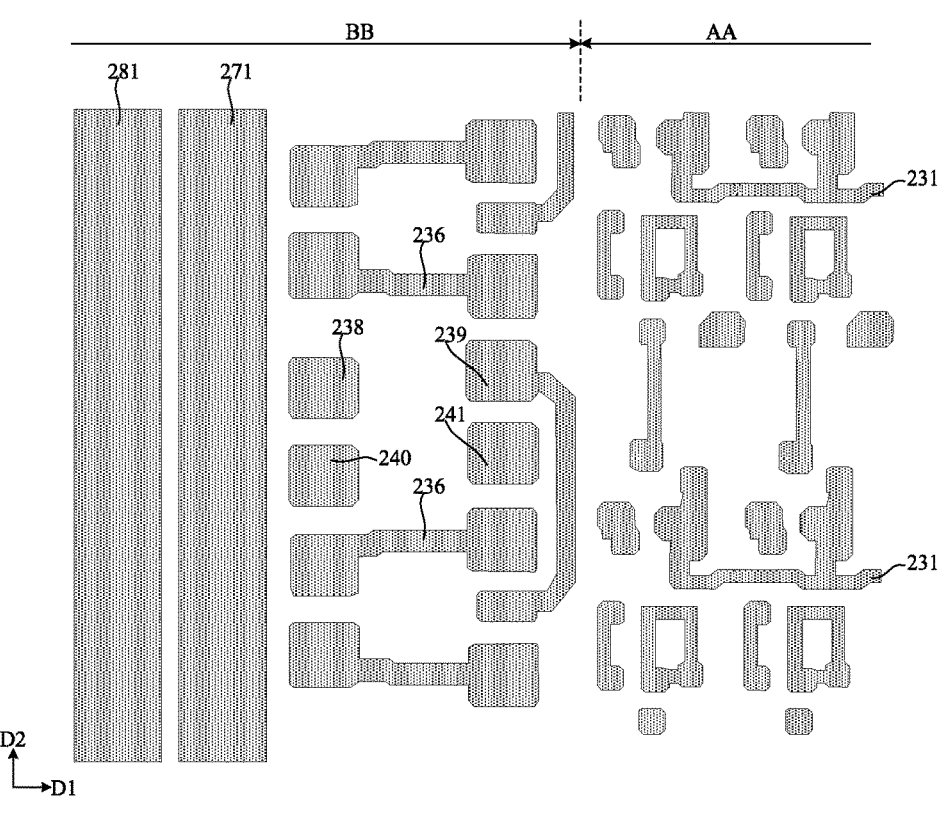
FIG. 14B is a schematic diagram of the third conductive layer in FIG. 7.
Figure 14C:
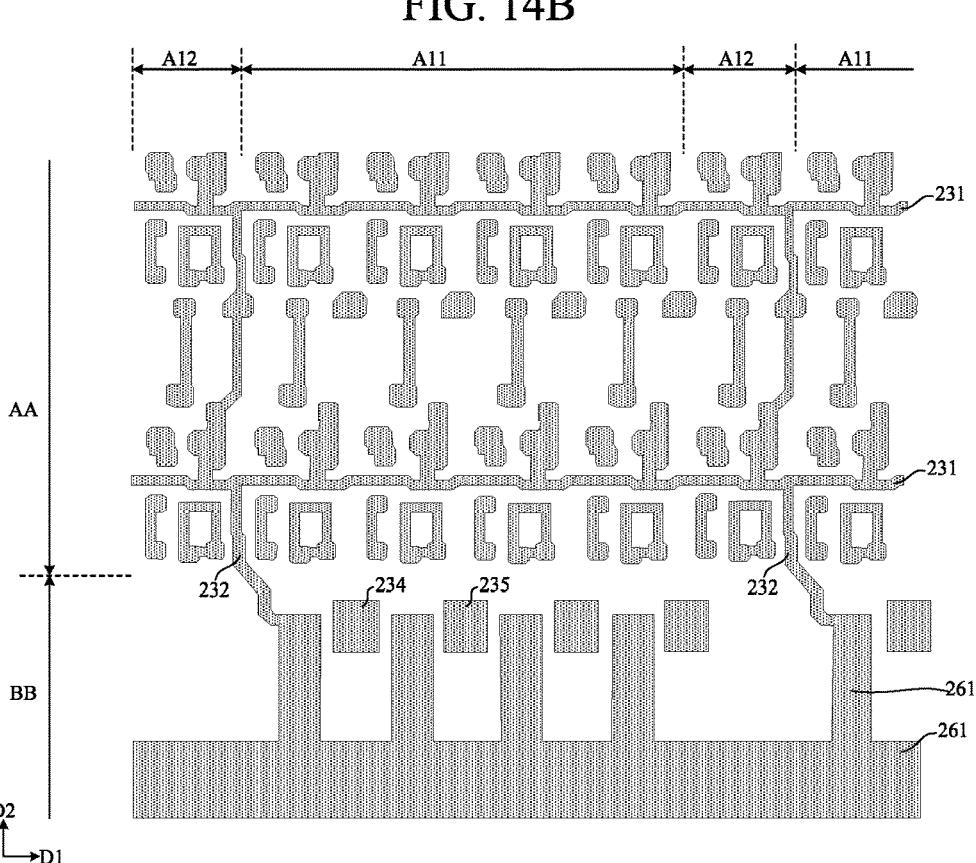
FIG. 14C is a schematic diagram of the third conductive layer in FIG. 8.

FIG. 13A is a schematic diagram of the circuit structure layer after a third conductive layer is formed in FIG. 5. FIG. 13B is a schematic diagram of the circuit structure layer after a third conductive layer is formed in FIG. 7. FIG. 13C is a schematic diagram of the circuit structure layer after a third conductive layer is formed in FIG. 8. FIG. 14A is a schematic diagram of the third conductive layer in FIG. 5. FIG. 14B is a schematic diagram of the third conductive layer in FIG. 7. FIG. 14C is a schematic diagram of the third conductive layer in FIG. 8.

In some examples, as shown in FIGS. 13A to 13C, and FIGS. 14A to 14C, the third conductive layer 23 of the first display region A1 may include: a plurality of connection electrodes (for example, including a first connection electrode 332, a second connection electrode 322, a third connection electrode 342, a fourth connection electrode 352, a fifth connection electrode 362, a sixth connection electrode 372, a seventh connection electrode 532, an eighth connection electrode 522, a ninth connection electrode 542, a tenth connection electrode 552, an eleventh connection electrode 562, and a twelfth connection electrode 572), a plurality of first traces 231, and a plurality of second traces 232.

In some examples, as shown in FIGS. 12A, 13A, and 14A, the first connection electrode 332 may be electrically connected with a first region of an active layer 310 of a first reset transistor 31 of the first pixel circuit through the first via V1, and may also be electrically connected with the first initial signal line INIT1 through the eighth via V8. The second connection electrode 322 may be electrically connected with a first region of an active layer 320 of a threshold writing transistor 32 of the first pixel circuit through the second via V2, and may also be electrically connected with a gate of a drive transistor 33 through the seventh via V7. The third connection electrode 342 may be electrically connected with a first region of an active layer 340 of a data writing transistor 34 of the first pixel circuit through the third via V3. The fourth connection electrode 352 may be electrically connected with a first region of an active layer 350 of a first light emitting control transistor 35 of the first pixel circuit through the fourth via V4, and may also be electrically connected with a second capacitor plate 382 of a storage capacitor 38 through the seventh via V7. The fifth connection electrode 362 may be electrically connected with a second region of an active layer 360 of a second light emitting control transistor 36 through the fifth via V5. The sixth connection electrode 372 may be electrically connected with a first region of an active layer 370 of a second reset transistor 37 of the first pixel circuit through the sixth via V6, and may also be electrically connected with the second initial signal line INIT2 through the tenth via V10.

In some examples, as shown in FIGS. 12A, 13A, and 14A, the seventh connection electrode 532 may be electrically connected with a first region of an active layer 510 of a first reset transistor 51 of the invalid pixel circuit through the eleventh via V11, and may also be electrically connected with the first initial signal line INIT1 through the eighteenth via V18. The eighth connection electrode 522 may be electrically connected with a first region of an active layer 520 of a threshold writing transistor 52 of the invalid pixel circuit through the twelfth via V12, and may also be electrically connected with a gate of a drive transistor 53 through the seventeenth via V7. The ninth connection electrode 542 may be electrically connected with a first region of an active layer 540 of a data writing transistor 54 of the invalid pixel circuit through the thirteenth via V13. The tenth connection electrode 552 may be electrically connected with a first region of an active layer 550 of a first light emitting control transistor 55 of the invalid pixel circuit through the fourteenth via V14, and may also be electrically connected with a second capacitor plate 582 of a storage capacitor 58 through the seventeenth via V17. The eleventh connection electrode 562 may be electrically connected with a second region of an active layer 560 of a second light emitting control transistor 56 through the fifteenth via V15. The twelfth connection electrode 572 may be electrically connected with a first region of an active layer 570 of a second reset transistor 57 of the invalid pixel circuit through the sixteenth via V16, and may also be electrically connected with the second initial signal line INIT2 through the twentieth via V20.

In some examples, as shown in FIGS. 13A and 14A, a second shielding electrode may include the first connection electrode 332 and the seventh connection electrode 532. A first shielding electrode may include the fourth connection electrode 352 and the tenth connection electrode 552. Orthographic projections of the first connection electrode 332 and the seventh connection electrode 532 on the base substrate may be substantially in a rectangular ring shape. An orthographic projection of the first connection electrode 332 on the base substrate may cover a channel region of the active layer 310 of the first reset transistor 31 of the first pixel circuit. An orthographic projection of the seventh connection electrode 532 on the base substrate may at least partially cover a channel region of the active layer 510 of the first reset transistor 51 of the invalid pixel circuit. Orthographic projections of the fourth connection electrode 352 and the tenth connection electrode 552 on the base substrate may be substantially d-shaped. An orthographic projection of the fourth connection electrode 352 on the base substrate may at least partially cover a channel region of the active layer 350 of the first light emitting control transistor 35 of the first pixel circuit. An orthographic projection of the tenth connection electrode 552 on the base substrate may at least partially cover a channel region of the active layer 550 of the first light emitting control transistor 55 of the invalid pixel circuit. In this example, channel regions of active layers of the first reset transistor and the first light emitting control transistor are shielded through the first shielding electrode and the second shielding electrode of the third conductive layer, the active layers may be prevented from being damaged by static electricity aggregation, thereby reducing an ESD risk of the display region.

In some examples, as shown in FIGS. 13A to 13C and FIGS. 14A to 14C, a shape of a first trace 231 of the first display region A1 may be a strip-shaped trace of which a main body portion extends along the first direction D1. The first trace 231 may be electrically connected with the fourth connection electrode 352 of the first circuit region A11 and the tenth connection electrode 552 of the second circuit region A12, for example, they may be of an integral structure. The first trace 231 may also be electrically connected with a second trace 232. As shown in FIG. 13B, an end of the first trace 231 in the first direction D1 may be electrically connected with the second trace 232. The first trace 231 is located within the first display region A1, is electrically connected with at least one second trace 232, and does not extend to the peripheral region. An orthographic projection of the first trace 231 on the base substrate may be located between two adjacent rows of pixel circuits, for example, may be located between orthographic projections of a light emitting control line and the second initial signal line on the base substrate.

In some examples, as shown in FIGS. 13A to 13C and FIGS. 14A to 14C, a shape of a second trace 232 may be a line segment of which a main body portion extends along the second direction D2. The second trace 232 may be located in the second circuit region A12. An orthographic projection of the second trace 232 on the base substrate may be overlapped with an orthographic projection of at least one invalid pixel circuit within the second circuit region A12 on the base substrate. The second trace 232 may be electrically connected with the ninth connection electrode 542 and the tenth connection electrode 552 of the invalid pixel circuit within the second circuit region A12. For example, the second trace 232 and, the ninth connection electrode 542 and the tenth connection electrode 552 may be of an integral structure. For example, the second trace 232 may include a plurality of sub-line segments. One sub-line segment may be connected between two adjacent first traces 231. For example, one end of the sub-line segment may be electrically connected directly with one first trace 231, and the other end may be electrically connected with another first trace 231 through the tenth connection electrode 552. The plurality of sub-line segments of the second trace 232 may be misaligned in the first direction D1. However, this embodiment is not limited thereto. In this example, the first trace 231 and the second trace 232 may be of an integral structure. Within the first display region A1, the first traces 231 and the second traces 232 are electrically connected to form a mesh connection structure.

In some examples, as shown in FIGS. 13A and 14A, the third conductive layer 23 of the second bezel region B2 may include a first power connection line 233. A shape of the first power connection line 233 may be a strip-shaped trace of which a main body portion extends along the first direction D1. An orthographic projection of the first power connection line 233 on the base substrate may be located on a side of the plurality of invalid semiconductor blocks 201 away from the first display region A1. The first power connection line 233 is electrically connected with at least one second trace 232. For example, the first power connection line 233 and the second trace 232 may be of an integral structure.

In some examples, as shown in FIGS. 13C and 14C, the third conductive layer 23 of the first bezel region B1 may include a plurality of data lead-out electrodes (e.g., a first data lead-out electrode 234 and a second data lead-out electrode 235), and a first sub-power supply line 261. The first data lead-out electrode 234 may be electrically connected with the second data fan-out line 221 through two twenty-second vias V22 disposed side by side. The second data lead-out electrode 235 may be electrically connected with the first data fan-out line 211 through two twenty-third vias V23 disposed side by side. A main body portion of the first sub-power supply line 261 may extend along the first direction D1. The first sub-power supply line 261 may have a plurality of protrusions 2611 facing the first display region A1. The first data lead-out electrode 234 may be located between two adjacent protrusions 2611, and the second data lead-out electrode 235 may be located between two adjacent protrusions 2611. A data lead-out electrode may be disposed between two adjacent protrusions 2611. At least one second trace 232 may be electrically connected with the first sub-power supply line 261. For example, one second trace 232 is electrically connected with one protrusion 2611 of the first sub-power supply line 261. The second trace 232 and the first sub-power supply line 261 may be of an integral structure.

In the present disclosure, being disposed side by side means being arranged along the first direction D1, and being disposed vertically means being arranged along the second direction D2.

In some examples, as shown in FIGS. 13B and 14B, the third conductive layer 23 of the third bezel region B3 may include a first initial transfer line 236, a second initial transfer line 237, a first scan transfer block 238, a second scan transfer block 239, a first light emitting control transfer block 240, and a second light emitting control transfer block 241.

In some examples, as shown in FIGS. 13B and 14B, one end of the first initial transfer line 236 may be electrically connected with the first initial signal line INIT1 through two twenty-fourth vias V24 disposed vertically, and the other end may be electrically connected with the third initial transfer line 222 through two twenty-fifth vias V25 disposed vertically. The first initial sub-trace 271 may be electrically connected with the third initial transfer line 222 through two twenty-sixth vias V26 disposed vertically. An electrical connection of the first initial signal line INIT1 and the first initial sub-trace 271 may be achieved through the first initial transfer line 236 of the third conductive layer and the third initial transfer line 222 of the second conductive layer. After preparation of the third conductive layer is completed, static electricity accumulated on the first initial signal line INIT1 may be led out to the peripheral region through the first initial transfer line 236 and the third initial transfer line 222.

In some examples, as shown in FIGS. 13B and 14B, one end of the second initial transfer line 237 may be electrically connected with the second initial signal line INIT2 through two twenty-seventh vias V27 disposed vertically, and the other end may be electrically connected with the fourth initial transfer line 223 through two twenty-eighth vias V28 disposed vertically. The second initial sub-trace 281 may be electrically connected with the fourth initial transfer line 223 through two twenty-ninth vias V29 disposed vertically. An electrical connection between the second initial signal line INIT2 and the second initial sub-trace 281 may be achieved through the second initial transfer line 237 of the third conductive layer and the fourth initial transfer line 223 of the second conductive layer. After preparation of the third conductive layer is completed, static electricity accumulated on the second initial signal line INIT2 may be led out to the peripheral region through the second initial transfer line 237 and the fourth initial transfer line 223.

In some examples, as shown in FIGS. 13B and 14B, the first scan transfer block 238 may be electrically connected with the scan output line 224 through two thirtieth vias V30 disposed vertically. One end of the second scan transfer block 239 may be electrically connected with one end of the scan line GL(n) through two thirty-fourth vias V34 disposed vertically, and the other end may be electrically connected with one end of the second reset control line RST2($n$) through two thirty-third vias V33 disposed horizontally. An orthographic projection of the first scan transfer block 238 on the base substrate may be a rectangle with rounded corners, and an orthographic projection of the second scan transfer block 239 on the base substrate may be substantially in a shape of a single-sided round bracket. However, this embodiment is not limited thereto.

In some examples, as shown in FIGS. 13B and 14B, the first light emitting control transfer block 240 may be electrically connected with the light emitting control output line 225 through two thirty-first vias V31 disposed vertically. The second light emitting control transfer block 241 may be electrically connected with one end of the light emitting control line EML(n) through two thirty-second vias V32 disposed vertically. The first light emitting control transfer block 240 and the second light emitting control transfer block 241 are oppositely disposed in the first direction D1. Orthographic projections of the first light emitting control transfer block 240 and the second light emitting control transfer block 241 on the base substrate may both be a rectangle with rounded corners. However, this embodiment is not limited thereto.

In some examples, as shown in FIGS. 13B and 14B, an end of the first initial transfer line 236 close to the first display region A1, a connection end of the second scan transfer block 239 with a scan line, the second light emitting control transfer line 241, an end of the second initial transfer line 237 close to the first display region A1, and a connection end of the second scan transfer block 239 with a second reset control line may be aligned in the second direction D2 and sequentially arranged. An end of the first initial transfer line 236 away from the first display region A1, the first scan transfer block 238, the first light emitting control transfer block 240, and an end of the second initial transfer line 237 away from the first display region A1 may be aligned in the second direction D2 and sequentially arranged.

FIG. 15A is a schematic diagram of the circuit structure layer after a fifth insulation layer is formed in FIG. 5. FIG. 15B is a schematic diagram of the circuit structure layer after a fifth insulation layer is formed in FIG. 7. FIG. 15C is a schematic diagram of the circuit structure layer after a fifth insulation layer is formed in FIG. 8.

In some examples, as shown in FIGS. 15A to 15C, the fifth insulation layer 105 of the first display region A1 may be provided with a plurality of vias, for example, which may include a forty-first via V41 to a forty-sixth via V46. The fifth insulation layer 105 and the fourth insulation layer 104 within the forty-first via V41 to the forty-sixth via V46 are removed to expose a surface of the third conductive layer 23.

In some examples, as shown in FIG. 15A, the fifth insulation layer 105 of the second bezel region B2 may be provided with a plurality of vias, for example, which may include a plurality of forty-seventh vias V47. The fifth insulation layer 105 and the fourth insulation layer 104 within the forty-seventh vias V47 are removed to expose a surface of the first power connection line 233 of the third conductive layer 23.

In some examples, as shown in FIG. 15C, the fifth insulation layer 105 of the first bezel region B1 may be provided with a plurality of vias, for example, which may include a forty-eighth via V48 and a forty-ninth via V49. The fifth insulation layer 105 and the fourth insulation layer 104 within the forty-eighth via V48 are removed to expose a surface of the first data lead-out electrode 234 of the third conductive layer 23. The fifth insulation layer 105 and the fourth insulation layer 104 within the forty-ninth via V49 are removed to expose a surface of the second data lead-out electrode 235 of the third conductive layer 23. The fifth insulation layer 105 of the first bezel region B1 may also be provided with a via or groove that exposes a surface of the first sub-power supply line 261.

In some examples, as shown in FIG. 15B, the fifth insulation layer 105 of the third bezel region B3 may be provided with a plurality of vias and a plurality of grooves, for example, which may include a fifty-first via V51 to a fifty-eighth via V58 and a first groove K1 and a second groove K2. The fifth insulation layer 105 and the fourth insulation layer 104 within the first groove K1 are removed to expose a surface of the first initial sub-trace 271 of the third conductive layer 23. The fifth insulation layer 105 and the fourth insulation layer 104 within the second groove K2 are removed to expose a surface of the second initial sub-trace 281 of the third conductive layer 23. The fifth insulation layer 105 and the fourth insulation layer 104 within the fifty-first via V51 to the fifty-eighth via V58 are removed to expose a surface of the third conductive layer 23.

In some examples, as shown in FIGS. 5, 7, and 8, the fourth conductive layer 24 of the first display region A1 may include a plurality of anode connection electrodes (e.g., a first anode connection electrode 242 and an invalid anode connection electrode 243), a plurality of data lines 244, a plurality of dummy data lines 245, and a plurality of first power supply transmission lines 246 and 247. The data lines 244, the dummy data lines 245, and the first power supply transmission lines 246 and 247 may all extend along the second direction D2.

In some examples, as shown in FIG. 5, the first anode connection electrode 242 may be located in the first circuit region A11 and electrically connected with the fifth connection electrode 362 through the forty-second via V42. The first anode connection electrode 242 may subsequently be electrically connected with an anode of a first light emitting element to achieve an electrical connection between the first pixel circuit and the first light emitting element. The invalid anode connection electrode 243 may be electrically connected with the eleventh connection electrode 562 through the forty-fifth via V45. The invalid anode connection electrode 243 does not need to be subsequently electrically connected with the anode of the light emitting element.

In some examples, as shown in FIG. 5, the data lines 244 may be located within the first circuit region A11. A data line 244 may be electrically connected with the third connection electrode 342 through the forty-first via V41. The data line 244 may be configured to provide a data signal to the data writing transistor 34 of the first pixel circuit. The dummy data lines 245 may be located within the second circuit region A12. A dummy data line 245 may be electrically connected with the ninth connection electrode 542 through the forty-fourth via V44. Since the ninth connection electrode 542 and the second trace 232 are of an integral structure, the dummy data line 245 is electrically connected with the second trace 232. An orthographic projection of the dummy data line 245 on the base substrate and an orthographic projection of the second trace 232 on the base substrate may be overlapped. The dummy data line 245 may provide a first voltage signal as a data signal to the data writing transistor 54 of the invalid pixel circuit.

In some examples, as shown in FIG. 5, a first power supply transmission line 246 may be located in the first circuit region A11 and electrically connected with the fourth connection electrode 352 through the forty-third via V43. The first power supply transmission line 246 may be configured to provide a first voltage signal to the first pixel circuit. A first power supply transmission line 247 may be located in the second circuit region A12 and electrically connected with the tenth connection electrode 552 through the forty-sixth via V46. Since the tenth connection electrode 552 and the second trace 232 are of an integral structure, the first power supply transmission line 247 is electrically connected with the second trace 232. An orthographic projection of the first power supply transmission line 247 on the base substrate and an orthographic projection of the second trace 232 on the base substrate may be overlapped.

In some examples, as shown in FIG. 5, the first power supply transmission lines 246 and 247 may extend to the second bezel region B2 and are respectively electrically connected with the first power connection line 233 through the forty-seventh via V47. In this example, static electricity of the display region may be led out to the peripheral region through the second trace 232 via the first power supply transmission lines 246 and 247.

In some examples, as shown in FIG. 8, the fourth conductive layer 24 of the first bezel region B1 may include a second sub-power supply line 262. The second sub-power supply line 262 may extend along the first direction D1 and be electrically connected with the first sub-power supply line 261 through a via or groove provided in the fifth insulation layer 105. The dummy data line 245 may extend to the first bezel region B1 and be electrically connected with the second sub-power supply line 262. For example, the dummy data line 245 and the second sub-power supply line 262 may be of an integral structure. The first power supply transmission lines 246 and 247 may extend to the first bezel region B1 and are electrically connected with the second sub-power supply line 262. For example, the first power supply transmission lines 246 and 247 and the second sub-power supply line 262 may be of an integral structure.

In some examples, as shown in FIG. 7, the fourth conductive layer 24 of the third bezel region B3 may include a fifth initial transfer line 252, a sixth initial transfer line 253, a scan transfer line 254, a light emitting control transfer line 255, a third initial sub-trace 272, and a fourth initial sub-trace 282. One end of the fifth initial transfer line 252 may be electrically connected with one end of the first initial transfer line 236 through the fifty-first via V51, and the other end may be electrically connected with the other end of the first initial transfer line 236 through the fifty-second via V52. One end of the sixth initial transfer line 253 may be electrically connected with one end of the second initial transfer line 237 through the fifty-third via V53, and the other end may be electrically connected with the other end of the second initial transfer line 237 through the fifty-fourth via V54. One end of the scan transfer line 254 may be electrically connected with the second scan transfer block 239 through the fifty-fifth via V55, and the other end may be electrically connected with the first scan transfer block 238 through the fifty-sixth via V56. One end of the light emitting control transfer line 255 may be electrically connected with the second light emitting control transfer block 241 through the fifty-seventh via V57, and the other end may be electrically connected with the first light emitting control transfer block 240 through the fifty-eighth via V58. In this example, the fifth initial transfer line 252, the scan transfer line 254, the light emitting control transfer line 255, and the sixth initial transfer line 253 are sequentially arranged along the second direction D2. By disposing the fifth initial transfer line 252 and the sixth initial transfer line 253 in the fourth conductive layer, uniformity of a structure of a film layer of the fourth conductive layer may be ensured, which is beneficial to preparation of a process.

In some examples, as shown in FIG. 7, the third initial sub-trace 272 and the fourth initial sub-trace 282 each extend along the second direction D2. The third initial sub-trace 272 may be electrically connected with the first initial sub-trace 271 through the first groove K1. The fourth initial sub-trace 282 may be electrically connected with the second initial sub-trace 281 through the second groove K2. In this example, the first initial peripheral trace 27 and the second initial peripheral trace 28 may both be double-layer traces.

In some examples, a structure of a film layer of the second pixel circuit may be referred to a structure of the first pixel circuit, and will not be repeated here. A structure of the fourth bezel region may refer to a structure of the third bezel region, and will not be repeated here.

Exemplary description is made below for a preparation process of a display substrate. A "patterning process" mentioned in the present disclosure includes coating with a photoresist, mask exposure, development, etching, photoresist stripping, and other treatments for a metal material, an inorganic material, or a transparent conductive material, and includes coating with an organic material, mask exposure, development, and other treatments for an organic material. Deposition may be any one or more of sputtering, evaporation, and chemical vapor deposition. Coating may be any one or more of spray coating, spin coating, and inkjet printing. Etching may be any one or more of dry etching and wet etching, which is not limited in present disclosure. A "thin film" refers to a layer of thin film made of a material on a base substrate using deposition, coating, or other processes. If the "thin film" does not need a patterning process in an entire manufacturing process, the "thin film" may also be called a "layer". If the "thin film" needs a patterning process in an entire manufacturing process, it is called a "thin film" before the patterning process, and called a "layer" after the patterning process. The "layer" after the patterning process includes at least one "pattern".

In some exemplary implementation modes, the preparation process of the display substrate may include following operations.

(1) Forming a semiconductor layer.

In some exemplary implementation modes, a semiconductor thin film is deposited on a base substrate 100, the semiconductor thin film is patterned through a patterning process to from a semiconductor layer 20 in a first display region A1 and a peripheral region, as shown in FIGS. 9A to 9C.

In some exemplary implementation modes, the base substrate 100 may be a rigid substrate, e.g., a glass substrate. However, this embodiment is not limited thereto. For example, the base substrate may be a flexible substrate.

(2) Forming a first conductive layer.

In some exemplary implementation modes, a first insulation thin film and a first conductive thin film are sequentially deposited on the base substrate 100 where the aforementioned structure is formed, and the first conductive thin film is patterned through a patterning process to form a first insulation layer 101 covering the semiconductor layer 20 and a first conductive layer 21 disposed on the first insulation layer 101, as shown in FIGS. 10A to 10C.

In some examples, after the first conductive layer 21 is formed, the semiconductor layer 20 is subjected to a conductorization treatment by using the first conductive layer 21 as a shield. A region of the semiconductor layer 20, which is shielded by the first conductive layer 21, may form a channel region of a transistor, and a region of the semiconductor layer 20, which is not shielded by the first conductive layer 21, may be conductorized, that is, first regions and second regions of active layers of seven transistors of a pixel circuit are all conductorized.

(3) Forming a second conductive layer.

In some exemplary implementation modes, a second insulation thin film and a second conductive thin film are sequentially deposited on the base substrate 100 where the aforementioned structures are formed, and the second conductive thin film is patterned through a patterning process to form a second insulation layer 102 and a second conductive layer 22 disposed on the second insulation layer 102, as shown in FIGS. 11A to 11C.

(4) Forming a third insulation layer.

In some exemplary implementation modes, a third insulation thin film is deposited on the base substrate 100 on which the aforementioned patterns are formed, and the third insulation thin film is patterned through a patterning process to form a third insulation layer 103, as shown in FIGS. 12A to 12C. The third insulation layer 103 may be provided with a plurality of vias, for example, the plurality of vias may expose surfaces of the semiconductor layer 20, the first conductive layer 21, and the second conductive layer 22 respectively.

(5) Forming a third conductive layer.

In some exemplary implementation modes, a third conductive thin film is deposited on the base substrate 100 on which the aforementioned patterns are formed, the third conductive thin film is patterned through a patterning process to form a third conductive layer 23 on the third insulation layer 103, as shown in FIGS. 13A to 13C and FIGS. 14A to 14C.

In this example, the third conductive layer 23 of the first display region A1 may include first traces 231 and second traces 232 forming a mesh connection structure. The second traces 232 may be located in a second circuit region A12. The first traces 231 may be located between adjacent rows of pixel circuits. The second traces 232 may extend to a second bezel region B2 to be electrically connected with a first power connection line 233, and may also extend to a first bezel region B1 to be electrically connected with a first sub-power supply line 261 of a first power supply line 26.

In some implementation modes, before the third conductive layer is prepared, long wires of the first conductive layer and the second conductive layer are prone to accumulate static electricity because there is no way to transfer other signal traces. When the first conductive layer and the second conductive layer are connected with an active layer of a transistor through the third conductive layer, since a resistance value of the active layer where a channel is formed changes from small resistance to large resistance, static electricity is easy to be released at a position where the resistance value changes, resulting in damage to the transistor. In this example, a first trace and a second trace are disposed in the third conductive layer and electrically connected with a first power supply line in the peripheral region, so that static electricity accumulated in the first conductive layer and the second conductive layer may be conducted to the peripheral region through the first trace and the second trace, thereby avoiding ESD generated in a display region from damaging the transistor and reducing an ESD risk of the display region. For example, before preparation of the third conductive layer, static electricity generated by process procedures is accumulated at the second conductive layer of a first light emitting control transistor, and after the preparation of the third conductive layer is completed, static electricity may be switched to the second trace via the first trace, and then led into the peripheral region via the second trace. Furthermore, by disposing a connection electrode that may cover a channel region of an active layer of a first light emitting transistor and a connection electrode that covers a channel region of an active layer of a first reset control transistor, an ESD risk in the display region may be reduced.

In this example, in the peripheral region, a first initial transfer line located in the third conductive layer is disposed to electrically connect a first initial peripheral trace and a first initial signal line, and a second initial transfer line is disposed to electrically connect a second initial peripheral trace and a second initial signal line, which may facilitate static electricity generated in the second conductive layer to be led out of the display region through the third conductive layer. For example, before the preparation of the third conductive layer, static electricity generated by process procedures will be accumulated on the first initial signal line and the second initial signal line, and after the preparation of the third conductive layer is completed, the static electricity may be led into the peripheral region via the first initial transfer line and the second initial transfer line of the third conductive layer, thus avoiding generated ESD from damaging the transistor.

(6) Forming a fourth insulation layer and a fifth insulation layer.

In some exemplary implementation modes, a fourth insulation thin film is deposited on the base substrate 100 on which the aforementioned patterns are formed to form a fourth insulation layer 104; subsequently a fifth insulation thin film is coated and patterned through a patterning process to form a fifth insulation layer 105, as shown in FIGS. 15A to 15C. In some examples, after a via or groove is formed in the fifth insulation layer 105, the fourth insulation layer 104 may be etched to form a via or groove provided in the fourth insulation layer 104 to expose a surface of the third conductive layer.

(7) Forming a fourth conductive layer.

In some exemplary implementation modes, a fourth conductive thin film is deposited on the base substrate 100 on which the aforementioned patterns are formed, and the fourth conductive thin film is patterned through a patterning process to form a fourth conductive layer 24, as shown in FIGS. 5, 7, and 8.

At this point, preparation of a circuit structure layer of the first display region A1 is completed. A second display region A2 may include the base substrate 100 and the first insulation layer 101, the second insulation layer 102, the third insulation layer 103, the fourth insulation layer 104, and the fifth insulation layer 105 stacked on the base substrate 100.

(8) Forming at least one transparent conductive layer and a light emitting structure layer sequentially. The light emitting structure layer may include an anode layer, a pixel definition layer, an organic emitting layer, and a cathode layer.

In some exemplary implementation modes, a first planarization thin film is coated on the base substrate formed with the aforementioned patterns, and the first planarization thin film is patterned through a patterning process to form a first planarization layer. A transparent conductive thin film is deposited on the base substrate on which the aforementioned patterns are formed, and the transparent conductive thin film is patterned through a patterning process to form a transparent conductive layer. The transparent conductive layer may include a transparent conductive line electrically connecting a second pixel circuit and a second light emitting element. Subsequently, a second planarization thin film is coated on the base substrate on which the aforementioned patterns are formed, and the second planarization thin film is patterned through a patterning process to form a second planarization layer. Subsequently, an anode thin film is deposited on the base substrate on which the aforementioned patterns are formed, and the anode thin film is patterned through a patterning process to form an anode layer. Subsequently, a pixel definition thin film is coated on the base substrate on which the aforementioned patterns are formed, and a pixel definition layer is formed through mask, exposure, and development processes. The pixel definition layer is formed with a plurality of pixel openings exposing the anode layer. Subsequently, an organic emitting layer is formed within the pixel openings formed above, and the organic emitting layer is connected with an anode. Subsequently, a cathode thin film is deposited, the cathode thin film is patterned through a patterning process to form a cathode layer, and the cathode layer is electrically connected with the organic emitting layer and a second power supply line respectively. In some examples, an encapsulation layer is formed on the cathode layer. The encapsulation layer may include a stacked structure of an inorganic material/an organic material/an inorganic material. In other examples, a plurality of transparent conductive layers may be disposed and a plurality of transparent conductive lines may be arranged in the plurality of transparent conductive layers. At least one planarization layer may be disposed between adjacent transparent conductive layers.

In some exemplary implementation modes, the first conductive layer 21, the second conductive layer 22, the third conductive layer 23, and the fourth conductive layer 24 may be made of a metal material, such as any one or more of Argentum (Ag), Copper (Cu), Aluminum (Al), and Molybdenum (Mo), or an alloy material of the above metals, such as an Aluminum-Neodymium alloy (AlNd) or a Molybdenum-Niobium alloy (MoNb), and may have a single-layer structure, or a multi-layer composite structure, such as Mo/Cu/Mo. The first insulation layer 101, the second insulation layer 102, the third insulation layer 103, and the fourth insulation layer 104 may be made of any one or more of Silicon Oxide (SiOx), Silicon Nitride (SiNx), and Silicon Oxynitride (SiON), and may be a single layer, a multi-layer, or a composite layer. The first insulation layer 101 and the second insulation layer 102 may be referred to as Gate Insulation (GI) layers, the third insulation layer 103 may be referred to as an Interlayer Dielectric (ILD) layer, and the fourth insulation layer 104 may be referred to as a passivation layer. The fifth insulation layer 105, the first planarization layer, and the second planarization layer may be made of an organic material, such as polyimide, acrylic, or polyethylene terephthalate. The pixel definition layer may be made of an organic material, such as polyimide, acrylic, or polyethylene terephthalate. The anode layer may be made of a reflective material such as a metal, and the cathode layer may be made of a transparent conductive material. However, this embodiment is not limited thereto.

A structure and the preparation process of the display substrate of this embodiment are merely illustrative. In some exemplary implementation modes, a corresponding structure may be changed and a patterning process may be increased or decreased according to actual needs. For example, a first trace may be located in the second conductive layer, a second trace may be located in the third conductive layer, and the first trace and the second trace may be electrically connected through a via provided in the third insulation layer. For another example, the first power supply line may extend to the third bezel region and the fourth bezel region, and the first trace may extend to the third bezel region and the fourth bezel region, and are directly electrically connected with the first power supply line. However, this embodiment is not limited thereto.

The preparation process of this exemplary embodiment may be implemented using a mature preparation device at present, and may be well compatible with an existing preparation process, simple in process implementation, easy to implement, high in a production efficiency, low in a production cost, and high in a yield.

In the display substrate provided by this embodiment, a mesh connection structure is formed by disposing first traces and second traces in a display region, and the second traces may be electrically connected with third traces (for example, including a first power supply line and a first power connection line) in a peripheral region, which may facilitate static electricity generated in process procedures to be led out of the display region. Moreover, a first initial transfer line and a second initial transfer line located in a third conductive layer are disposed in the peripheral region to achieve an electrical connection between an initial signal line and an initial peripheral trace, which may facilitate ESD generated in a second conductive layer to be led out of the display region, reduce an incidence of ESD defects in the display region, and improve a product yield of the display substrate.

FIG. 16A is another partial enlarged schematic diagram of a circuit structure layer of a region S2 in FIG. 5. FIG. 16B is a schematic diagram of the circuit structure layer after a third conductive layer is formed in FIG. 16A. In some examples, as shown in FIGS. 16A and 16B, the third conductive layer 23 of the third bezel region B3 may include a first initial transfer line 236, a second initial transfer line 237, a scan transfer line 254, a light emitting control transfer line 255, a second scan transfer block 239, a first initial sub-trace 271, and a second initial sub-trace 281. The first initial transfer line 236 may be electrically connected with the first initial signal line INIT1, and electrically connected with the first initial sub-trace 271 of the third conductive layer 23 through a third initial transfer line of the second conductive layer 22. The second initial transfer line 237 may be electrically connected with the second initial signal line INIT2, and electrically connected with the second initial sub-trace 281 of the third conductive layer 23 through a fourth initial transfer line of the second conductive layer 22. The scan transfer line 254 and the second scan transfer block 239 may be of an integral structure. The scan transfer line 254 may achieve an electrical connection between a scan line and a scan output line located in the second conductive layer. The light emitting control transfer line 255 may achieve an electrical connection between a light emitting control line and a light emitting control output line located in the second conductive layer.

In this example, in the peripheral region, a scan transfer line and a light emitting control transfer line located in the third conductive layer are disposed, which may facilitate static electricity generated in the first conductive layer to be led out of the display region through the third conductive layer. For example, before the preparation of the third conductive layer, static electricity generated by process procedures will be accumulated on a scan line, a light emitting control line, a first reset control line, and a second reset control line, and after the preparation of the third conductive layer is completed, the static electricity may be led into the peripheral region through the scan transfer line and the light emitting control transfer line of the third conductive layer, thus avoiding generated ESD from damaging a transistor.

Rest of the structure of the display substrate according to this embodiment may be as described above, and will not be repeated here.

At least one embodiment of the present disclosure also provides a display apparatus which includes the display substrate as described above.

FIG. 17 is a schematic diagram of a display apparatus according to at least one embodiment of the present disclosure. As shown in FIG. 17, this embodiment provides a display apparatus, which includes a display substrate 91 and a photosensitive sensor 92 located on a light exit side of a light emitting structure layer away from the display substrate 91. The photosensitive sensor 92 is located on a non-display side of the display substrate 91. An orthographic projection of the photosensitive sensor 92 on the display substrate 91 is overlapped with a first display region A1.

In some exemplary implementation modes, the display substrate 91 may be a flexible OLED display substrate, a QLED display substrate, a Micro-LED display substrate, or a Mini-LED display substrate. The display apparatus may be a product having a function for displaying an image (including a static image or a dynamic image, wherein the dynamic image may be a video). For example, the display apparatus may be any product of a display, a television, a billboard, a digital photo frame, a laser printer with a display function, a telephone, a mobile phone, a picture screen, a Personal Digital Assistant (PDA), a digital camera, a portable camcorder, a viewfinder, a navigator, a vehicle, a large-area wall, an information inquiry equipment (such as business inquiry equipment of departments such as e-government, banks, hospitals, electric power), and a monitor, etc. For another example, the display apparatus may be any one of a micro-display, a Virtual Reality (VR) device or an Augmented Reality (AR) device containing a micro-display.

The drawings of the present disclosure only involve structures involved in the present disclosure, and other structures may refer to conventional designs. The embodiments of the present disclosure, i.e., features in the embodiments, may be combined with each other to obtain new embodiments if there is no conflict. Those of ordinary skills in the art should understand that modifications or equivalent replacements may be made on the technical solutions of the present disclosure without departing from the spirit and scope of the technical solutions of the present disclosure, and shall all fall within the scope of the claims of the present disclosure.

The invention claimed is:

1. A display substrate, comprising:
a base substrate, comprising a display region and a peripheral region located at a periphery of the display region; wherein the display region comprises a first display region and a second display region, and the first display region at least partially surrounds the second display region;
a circuit structure layer located on the base substrate, comprising a plurality of pixel circuits, at least one first trace extending along a first direction, at least one second trace extending along a second direction, and at least one third trace located in the peripheral region; wherein the first direction and the second direction intersect; the plurality of pixel circuits, the first trace, and the second trace are located in the first display region; and
a light emitting structure layer located on a side of the circuit structure layer away from the base substrate, comprising a plurality of first light emitting elements located in the first display region and a plurality of second light emitting elements located in the second display region, wherein:
the plurality of pixel circuits comprises a plurality of first pixel circuits and a plurality of second pixel circuits; at least one first pixel circuit in the plurality of first pixel circuits is electrically connected with at least one first light emitting element in the plurality of first light emitting elements, and at least one second pixel circuit in the plurality of second pixel circuits is electrically connected with at least one second light emitting element in the plurality of second light emitting elements;
the at least one first trace is electrically connected with the at least one second trace, and the at least one third trace is electrically connected with at least one of following: the at least one first trace and the at least one second trace; and
an orthographic projection of the at least one first trace on the base substrate is located between two adjacent rows of pixel circuits.

2. The display substrate according to claim 1, wherein the at least one first trace and the at least one second trace are of an integral structure.

3. The display substrate according to claim 2, wherein the plurality of pixel circuits further comprise: a plurality of invalid pixel circuits, an orthographic projection of the at least one second trace on the base substrate is overlapped with an orthographic projection of at least one invalid pixel circuit on the base substrate.

4. The display substrate according to claim 2, wherein the peripheral region comprises: a first bezel region and a second bezel region located on opposite sides of the display region along the second direction; the at least one third trace comprises: a first power supply line located in the first bezel region and a first power connection line located in the second bezel region; the at least one second trace is electrically connected with at least one of the first power connection line and the first power supply line.

5. The display substrate according to claim 2, wherein in a direction perpendicular to the display substrate, the circuit structure layer of the first display region comprises: a semiconductor layer, a first conductive layer, a second conductive layer, and a third conductive layer disposed on the base substrate;

the semiconductor layer at least comprises: an active layer of a transistor of at least one pixel circuit;

the first conductive layer at least comprises: a gate of the transistor of the at least one pixel circuit and a first capacitor plate of a storage capacitor;

the second conductive layer at least comprises: a second capacitor plate of the storage capacitor of the at least one pixel circuit;

the third conductive layer at least comprises the first trace and the second trace.

6. The display substrate according to claim 1, wherein the plurality of pixel circuits further comprise: a plurality of invalid pixel circuits, an orthographic projection of the at least one second trace on the base substrate is overlapped with an orthographic projection of at least one invalid pixel circuit on the base substrate.

7. The display substrate according to claim 1, wherein the peripheral region comprises: a first bezel region and a second bezel region located on opposite sides of the display region along the second direction; the at least one third trace comprises: a first power supply line located in the first bezel region and a first power connection line located in the second bezel region; the at least one second trace is electrically connected with at least one of the first power connection line and the first power supply line.

8. The display substrate according to claim 5, wherein the first power supply line comprises a first sub-power supply line and a second sub-power supply line stacked and electrically connected with each other; the at least one second trace, the first power connection line, and the first sub-power supply line are of an integral structure.

9. The display substrate according to claim 1, wherein in a direction perpendicular to the display substrate, the circuit structure layer of the first display region comprises: a semiconductor layer, a first conductive layer, a second conductive layer, and a third conductive layer disposed on the base substrate;

the semiconductor layer at least comprises: an active layer of a transistor of at least one pixel circuit;

the first conductive layer at least comprises: a gate of the transistor of the at least one pixel circuit and a first capacitor plate of a storage capacitor;

the second conductive layer at least comprises: a second capacitor plate of the storage capacitor of the at least one pixel circuit;

the third conductive layer at least comprises the first trace and the second trace.

10. The display substrate according to claim 9, wherein the circuit structure layer of the first display region further comprises: a fourth conductive layer located on a side of the third conductive layer away from the base substrate;

the fourth conductive layer at least comprises a data line, a dummy data line, and a first power supply transmission line;

the data line is electrically connected with the plurality of first pixel circuits or the plurality of second pixel circuits, the first power supply transmission line is electrically connected with the plurality of pixel circuits, and the dummy data line is electrically connected with the second trace;

the dummy data line and the first power supply transmission line are both electrically connected with the third trace.

11. The display substrate according to claim 9, wherein the second conductive layer further comprises: a first initial signal line and a second initial signal line; the first initial signal line and the second initial signal line both extend along the first direction;

the peripheral region further comprises: a first initial peripheral trace and a second initial peripheral trace; the first initial peripheral trace and the second initial peripheral trace extend along the second direction;

the first initial signal line is electrically connected with the first initial peripheral trace through a first initial transfer line; the second initial signal line is electrically connected with the second initial peripheral trace through a second initial transfer line; the first initial transfer line and the second initial transfer line are located in the third conductive layer.

12. The display substrate according to claim 9, wherein the first conductive layer further comprises: a scan line and a light emitting control line extending along the first direction;

the peripheral region further comprises a scan output line and a light emitting control output line;

the scan line is electrically connected with the scan output line through a scan transfer line; the light emitting control line is electrically connected with the light emitting control output line through a light emitting control transfer line;

the scan transfer line and the light emitting control transfer line are located in the third conductive layer, and the scan output line and the light emitting control output line are located in the second conductive layer or the first conductive layer.

13. The display substrate according to claim 9, wherein the pixel circuit at least comprises: a drive transistor and a first light emitting control transistor, the first light emitting control transistor has a gate electrically connected with a light emitting control line, a first electrode electrically connected with a first power supply line, and a second electrode electrically connected with a first electrode of the drive transistor; the third conductive layer further comprises: a first shielding electrode; an orthographic projection of the first shielding electrode on the base substrate at least partially covers an orthographic projection of a channel region of an active layer of the first light emitting control transistor on the base substrate.

14. The display substrate according to claim 13, wherein the pixel circuit further comprises: a first reset transistor, the first reset transistor has a gate electrically connected with a first reset control line, a first electrode electrically connected with a first initial signal line, and a second electrode electrically connected with a gate of the drive transistor;

the third conductive layer further comprises: a second shielding electrode; an orthographic projection of the second shielding electrode on the base substrate at least partially covers an orthographic projection of a channel region of an active layer of the first reset transistor on the base substrate.

15. The display substrate according to claim 9, wherein a third insulation layer is disposed between the second conductive layer and the third conductive layer, and the third insulation layer of the first display region is provided with a plurality of vias; a distance between an orthographic projection of at least one via on the base substrate and an orthographic projection of at least one trace of the first conductive layer or the second conductive layer on the base substrate in the second direction is greater than or equal to 2 microns.

16. The display substrate according to claim 10, wherein the second conductive layer further comprises: a first initial signal line and a second initial signal line; the first initial signal line and the second initial signal line both extend along the first direction;

> the peripheral region further comprises: a first initial peripheral trace and a second initial peripheral trace; the first initial peripheral trace and the second initial peripheral trace extend along the second direction;
> the first initial signal line is electrically connected with the first initial peripheral trace through a first initial transfer line; the second initial signal line is electrically connected with the second initial peripheral trace through a second initial transfer line; the first initial transfer line and the second initial transfer line are located in the third conductive layer.

17. A display apparatus, comprising a display substrate according to claim 1.

18. The display apparatus according to claim 17, further comprising: a sensor located on a side of a non-display surface of the display substrate, wherein an orthographic projection of the sensor on the display substrate is overlapped with a second display region of the display substrate.

\* \* \* \* \*